United States Patent
Tanaka et al.

(10) Patent No.: US 7,839,312 B2
(45) Date of Patent: Nov. 23, 2010

(54) CODER

(75) Inventors: Toshihiro Tanaka, Hyogo (JP); Keiichi Ishida, Hyogo (JP)

(73) Assignee: Panasonic Corporation, Osaka (JP)

(*) Notice: Subject to any disclaimer, the term of this patent is extended or adjusted under 35 U.S.C. 154(b) by 91 days.

(21) Appl. No.: 12/439,004

(22) PCT Filed: Oct. 11, 2007

(86) PCT No.: PCT/JP2007/069824

§ 371 (c)(1),
(2), (4) Date: Feb. 26, 2009

(87) PCT Pub. No.: WO2008/065814

PCT Pub. Date: Jun. 5, 2008

(65) Prior Publication Data

US 2010/0007532 A1    Jan. 14, 2010

(30) Foreign Application Priority Data

Nov. 30, 2006   (JP) .............................. 2006-323384

(51) Int. Cl.
*H03M 7/00*   (2006.01)
(52) U.S. Cl. ............................ 341/107; 341/50; 341/51
(58) Field of Classification Search ............ 375/240.18, 375/240.16; 341/107, 50, 51
See application file for complete search history.

(56) References Cited

U.S. PATENT DOCUMENTS 5,410,352 A    4/1995   Watanabe

| | | |
|---|---|---|
| 5,870,145 A | 2/1999 | Yada et al. |
| 6,411,231 B1* | 6/2002 | Yanagiya et al. ............ 341/107 |
| 6,850,175 B1 | 2/2005 | Bossen |
| 2002/0114527 A1 | 8/2002 | Horie |

(Continued)

FOREIGN PATENT DOCUMENTS

JP          5-252403 A          9/1993

(Continued)

OTHER PUBLICATIONS

English language abstract of JP 2005-184232 A, Jul. 7, 2005.

(Continued)

*Primary Examiner*—Jean B Jeanglaude
(74) *Attorney, Agent, or Firm*—Greenblum & Bernstein P.L.C.

(57) ABSTRACT

A coder has a binarizing circuit (130) for converting multi-valued data into a binary symbol sequence, the multivalued data being generated from an input signal and having a plurality of contexts, an arithmetic code amount approximating circuit (200) for calculating a prediction code amount in the predetermined coding unit from the binary symbol sequence, and a coding circuit (102) for coding the input signal arithmetically on the basis of the prediction code amount. The arithmetic code amount approximating circuit (200) includes a selector (230) for dividing the binary symbol sequence into a plurality of groups based on the contexts, a plurality of code amount approximating circuits (211-214) for calculating, from the binary symbol sequence divided into a plurality of groups, the prediction code amount of the group based on at least the section range in arithmetic coding, and an adder (231) for adding the prediction code amounts from all code amount approximating circuits and outputting the prediction code amount in the specified coding unit.

10 Claims, 24 Drawing Sheets

U.S. PATENT DOCUMENTS

| | | | |
|---|---|---|---|
| 2002/0114529 A1 | 8/2002 | Horie | |
| 2005/0129122 A1* | 6/2005 | Booth et al. | 375/240.16 |
| 2005/0129320 A1 | 6/2005 | Koto | |
| 2005/0156762 A1 | 7/2005 | Tsuru | |
| 2005/0180505 A1 | 8/2005 | Ogawa et al. | |
| 2005/0243930 A1 | 11/2005 | Asano et al. | |
| 2005/0249289 A1* | 11/2005 | Yagasaki et al. | 375/240.18 |
| 2007/0033019 A1 | 2/2007 | Yasunaga et al. | |
| 2007/0100613 A1 | 5/2007 | Yasunaga et al. | |
| 2007/0255558 A1 | 11/2007 | Yasunaga et al. | |
| 2008/0275698 A1 | 11/2008 | Yasunaga et al. | |
| 2009/0012781 A1 | 1/2009 | Yasunaga et al. | |

FOREIGN PATENT DOCUMENTS

| | | | |
|---|---|---|---|
| JP | 4111055528 | * | 2/1999 |
| JP | 2003-18593 A | | 1/2003 |
| JP | 2004-135251 A | | 4/2004 |
| JP | 2004-135252 A | | 4/2004 |
| JP | 2005-151391 A | | 6/2005 |
| JP | 2005-184232 A | | 7/2005 |
| JP | 2005-203905 A | | 7/2005 |
| JP | 2005-252374 A | | 9/2005 |
| JP | 2005-318296 A | | 11/2005 |
| WO | 96/28937 | | 9/1996 |
| WO | 2004/028165 | | 4/2004 |

OTHER PUBLICATIONS

English language abstract of JP 2004-135252 A, Apr. 30, 2004.
English language abstract of JP 2004-135251 A, Apr. 30, 2004.
English language abstract of JP 2005-151391 A, Jun. 9, 2005.
English language abstract of JP 2003-18593 A, Jan. 17, 2003.
English language abstract of JP 2005-318296 A, Nov. 10, 2005.
English language abstract of JP 2005-203905 A, Jul. 28, 2005.
Yamakage et al., "HD DVD ni Mochiru Dogazo Fugoka Gijutsu", Toshiba Review, vol. 60, No. 1, Jan. 1, 2005, pp. 17-20.
ITU-T Recommendation H.264, "Series H: Audiovisual and multimedia Systems, Infrastructure of audiovisual services—Coding of moving video, Advanced video coding for generic audiovisual services," Nov. 2007.
English language abstract of JP 2005-252374 A, Sep. 15, 2005.
English language abstract of JP 5-252403 A, Sep. 28, 1993.
U.S. Appl. No. 12/439,021 to Tanaka, filed Feb. 26, 2009.

* cited by examiner

Fig.4

| SYNTAX ELEMENT | | VALUE OF ctxIdx RELATIVE TO INTRA(I) SLICE | CODE AMOUNT APPROXIMATING CIRCUIT |
|---|---|---|---|
| LUMINANCE | coded_block_flag | 85-96 | #1 |
| | significant_coeff_flag[ ] | 105-148<br>277-320<br>402-416<br>436-450 | |
| | last_significant_coeff_flag[ ] | 166-209<br>338-381<br>417-425<br>451-459 | |
| | coeff_abs_level_minus1[ ] | 227-256<br>426-435 | #2 |
| | coeff_sign_flag | N/A(BYPASS) | |
| COLOR DIFFERENCE | coded_block_flag | 97-104 | #3 |
| | significant_coeff_flag[ ] | 149-165<br>321-337 | |
| | last_significant_coeff_flag[ ] | 210-226<br>382-398 | |
| | coeff_abs_level_minus1[ ] | 257-275 | #4 |
| | coeff_sign_flag | N/A(BYPASS) | |

Fig.10A

```
static unsigned int mTbl[256];   /* FRACTION CODE AMOUNT TABLE */
                                 /* ARGUMENT:codIRange - 256 */ unsigned int readTableCdFrac( int x )
{
   if( (x >= 512) || (x < 256) ){
      return 0;
   }
   return mTbl[x - 256];
}
```

Fig.10B

```
void initTableCdFrac()
{
  /*CONSTRUCTOR*/
  int i;
  double rbits;
  int number;

for( i = 256 ; i < 512 ; i++)
  {
    rbits = log( 510.0 / (double)i)/log(2.0);
    number = (int)(rbits*512.0+0.5);
    mTbl[i-256] = min(number, 511);
  }
}
```

Fig.13

```
#define MAX_RUN 13
static unsigned int mCdIntTbl[MAX_RUN+1][2][64];    /* INTEGER CODE AMOUNT TABLE */
static unsigned int mRngTbl[MAX_RUN+1][2][64];      /* RANGE TABLE */
static unsigned int mMpsTbl[MAX_RUN+1][2][64];      /* MPS TABLE */
static unsigned int mStateTbl[MAX_RUN+1][2][64];    /* pState TABLE */ unsigned int readTableCdInt(int run_length, int valMPS, int pStateIdx)
{
    return mCdIntTbl[run_lenth][valMPS][pStateIdx];
} unsigned int readTableRng(int run_length, int valMPS, int pStateIdx)
{
    return mRngTbl[run_lenth][valMPS][pStateIdx];
} unsigned int readTableMps(int run_length, int valMPS, int pStateIdx)
{
    return mMpsTbl[run_lenth][valMPS][pStateIdx];
} unsigned int readTableState(int run_length, int valMPS, int pStateIdx)
{
    return mStateTbl[run_lenth][valMPS][pStateIdx];
}
```

*Fig.14*

```
unsigned int initTableCdInt( int run_length, int valMPS, int pStateIdx)
{
    int cdInt = 0;
    int inMPS = valMPS;
    int inState = pStateIdx;

for (int i = 0; i<run_length; i++){
        Proc1Bin (1, &valMPS, &pStateIdx);
        while (codIRange < 256) {
            codIRange = codIRange << 1;
            cdInt++;
        }
    }
    if (run_length < MAX_RUN){
        Proc1Bin (0, &valMPS, &pStateIdx);
        while (codIRange < 256) {
            codIRange = codIRange << 1;
            cdInt++;
        }
    } mCdIntTbl [run_length][inMPS][inState] = cdInt;
    mRngTbl [run_length][inMPS][inState] = cdIRange;
    mMpsTbl [run_length][inMPS][inState] = valMPS;
    mStateTbl [run_length][inMPS][inState] = pStateIdx;
}
```

Fig.18A

CASE OF NORMAL RASTER SCAN
(PROGRESSIVE)

| 0 | 20 | 0 | 20 | 0 | 20 | 0 | 20 | → LINE 1 |
|---|----|---|----|---|----|---|----|---|
| 20 | 0 | 20 | 0 | 20 | 0 | 20 | 0 | → LINE 2 |
| 0 | 20 | 0 | 20 | 0 | 20 | 0 | 20 | |
| 20 | 0 | 20 | 0 | 20 | 0 | 20 | 0 | |
| | | | | | | | | |

Fig.18B

CASE OF PAIRING MACRO BLOCKS
(INTERLACE)

| | 0 | 20 | 0 | 20 | 0 | 20 | 0 | 20 | |
|---|---|----|---|----|---|----|---|----|---|
| PAIR | 0 | 20 | 0 | 20 | 0 | 20 | 0 | 20 | } LINE 1 |
| | 20 | 0 | 20 | 0 | 20 | 0 | 20 | 0 | |
| | 20 | 0 | 20 | 0 | 20 | 0 | 20 | 0 | } LINE 2 |
| | | | | | | | | | |

Fig.19A

QUANTIZATION PARAMETER QP : $0 \leq QP \leq 51$
NUMBER OF REPRESENTATIVE QUANTIZATION PARAMETERS $Q=10$ $qP_1(x) = \{0, 4, 8, 12, 16, 22, 28, 34, 42, 51\}$, $0 \leq x \leq 9$
$QP_1(n) \in qP_1(x)$  $0 \leq n \leq 2039$, $0 \leq x \leq 9$

Fig.19B

CASE OF NORMAL RASTER SCAN
(PROGRESSIVE)

$QP_1(n)$

| 0 | 4 | 8 | 12 | 16 | 22 | 28 | 34 | 42 | 51 | 0 | → LINE 1 |
|---|---|---|----|----|----|----|----|----|----|---|---|
| 34 | 42 | 51 | 0 | 4 | 8 | 12 | 16 | 22 | 28 | 34 | → LINE 2 |
| 16 | 22 | 28 | 34 | 42 | 51 | 0 | 4 | 8 | 12 | 16 | |
| 4 | 8 | 12 | 16 | 22 | 28 | 34 | 42 | 51 | 0 | 4 | |

Fig.19C

CASE OF PAIRING MACRO BLOCKS
(INTERLACE)

PAIR  $QP_1(n)$

| 0 | 4 | 8 | 12 | 16 | 22 | 28 | 34 | 42 | 51 | 0 | ⎫ LINE 1 |
|---|---|---|----|----|----|----|----|----|----|---|---|
| 0 | 4 | 8 | 12 | 16 | 22 | 28 | 34 | 42 | 51 | 0 | ⎭ |
| 34 | 42 | 51 | 0 | 4 | 8 | 12 | 16 | 22 | 28 | 34 | ⎫ LINE 2 |
| 34 | 42 | 51 | 0 | 4 | 8 | 12 | 16 | 22 | 28 | 34 | ⎭ |

Fig.20A $qp_1(x)=\{0, 4, 8, 12, 16, 22, 28, 34, 42, 51\}$ $0 \leq x \leq 9$ (TEN TYPES)

$QP_1(n) \in qp_1(x)$  $0 \leq n \leq 2039$, $0 \leq x \leq 9$

Fig.20B

EVERY-QP PREDICTION CODE AMOUNT :
$r_1(x)=\{95626, 82252, 64551, 48648, 31785, 19098, 10373, 5439, 2259, 1261\}$

Fig.23

```
1. preCtxState = Clip3( 1, 126, ( ( ( m * Clip3( 0, 51, SliceQPY) ) >> 4 ) + n )
2. if( preCtxStaet <= 63) {
       pStateIde = 63 - preCtxState
       valMPS = 0
   } else {
       pStateIdx = preCtxState - 64
       valMPS = 1
   }
```

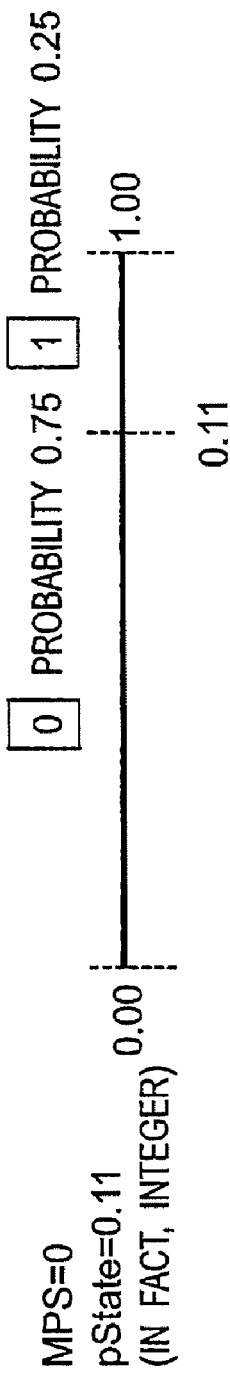
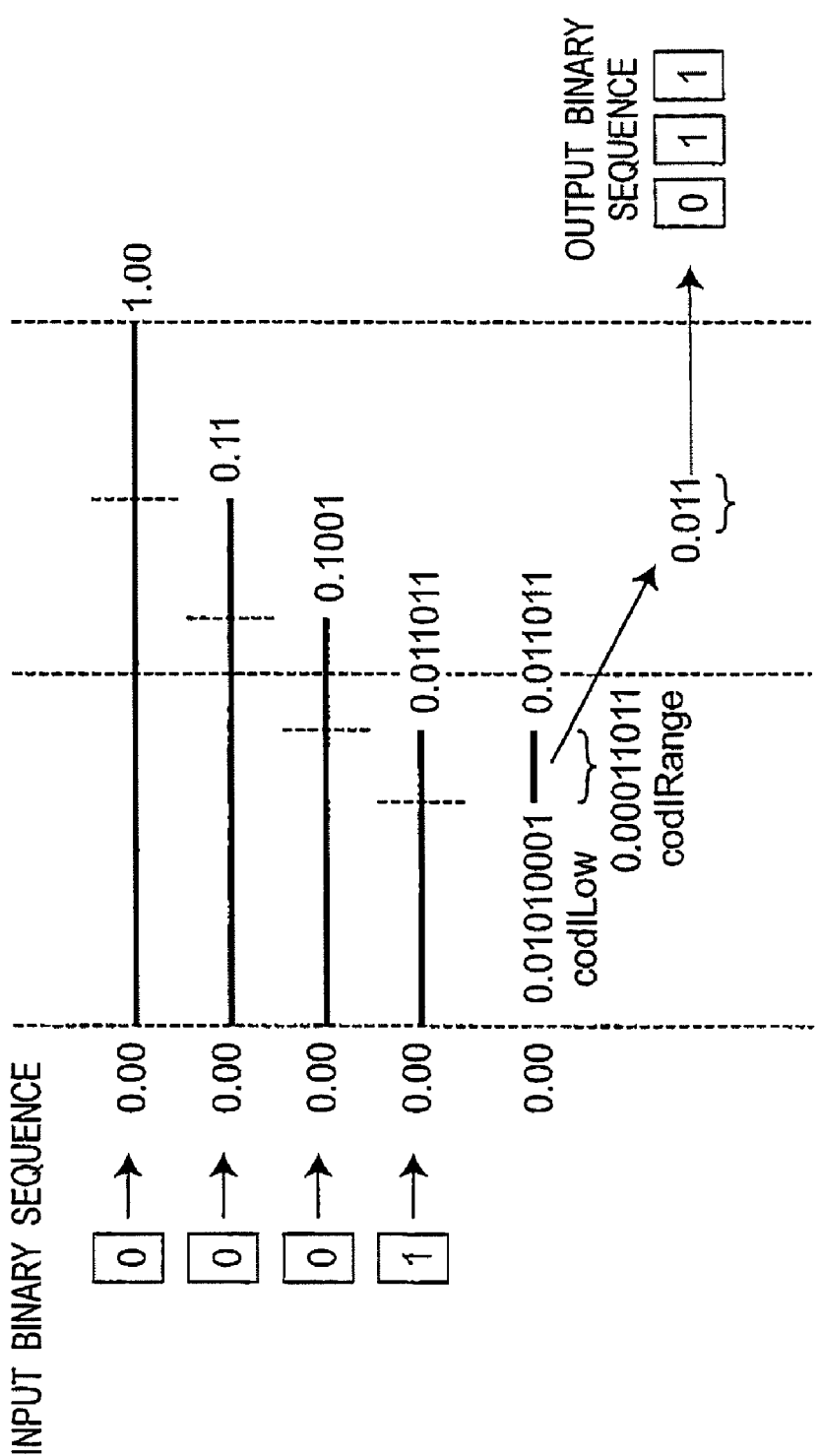
Fig.24A
Fig.24B

CODER

TECHNICAL FIELD

The present invention relates to a coder and coding method, and more particularly to a Coder and coding method applying arithmetic coding.

BACKGROUND ART

Arithmetic coding is a technology capable of reversibly compressing the quantity of information up to theoretical limits depending on the occurrence probability of information source symbols. Arithmetic coding is applied in the image coding fields in JPEG2000 standard (ISO/IEC15444), H.264/MPEG4-AVC standard (see, for example, non-patent document 1, hereinafter called H.264 standard), and others. For example, in H.264, Context Adaptive Binary Arithmetic Coding (CABAC) is applied, and coding of high efficiency is realized depending on the probability characteristic of syntax.

Context Adaptive Binary Arithmetic Coding in H.264 is explained by referring to FIG. 22. FIG. 22 is a diagram explaining a context adaptive binary arithmetic coding circuit.

A context adaptive binary arithmetic coding circuit 145 in FIG. 22 includes a binarizing circuit 130, a context calculating circuit 520, and an arithmetic coding circuit 140. The operation of the circuits is explained below.

The binarizing circuit 130 binarizes multivalued input data composed of conversion coefficient data, flags and other coding information. Binarization is performed by judging the syntax element showing the type of the input data from the control information, and using a method such as unary binarization and fixed-length binarization depending on the data probability characteristic as shown in Table 1.

TABLE 1

| Value of syntax element | Bin string | | | | | |
|---|---|---|---|---|---|---|
| 0 (I N × N) | 0 | | | | | |
| 1 | 1 | 0 | | | | |
| 2 | 1 | 1 | 0 | | | |
| 3 | 1 | 1 | 1 | 0 | | |
| 4 | 1 | 1 | 1 | 1 | 0 | |
| 5 | 1 | 1 | 1 | 1 | 1 | 0 |
| ... | | | | | | |
| binIdx | 0 | 1 | 2 | 3 | 4 | 5 |

In the unary binarization shown in Table 1, binarization is performed by converting multivalued input data 0, 1, 2, 3, 4, 5, . . . into binary symbols (Bin string) 0, 10, 110, 1110, 11110, 111110, . . . . Binarized binary symbol sequences are input into the (binary) arithmetic coding circuit 140. Unary binarization is used for binarizing values of equal to or smaller than 14 in coeff_abs_level_minus1 showing the level of conversion coefficient.

The context calculating circuit 520 determines the value of context index (ctxIdx) used in coding of present 1 bit in the binary symbol sequence on the basis of the control information showing the syntax element according to Table 2 specified in the H.264 standard.

TABLE 2

| | | Slice type | | | |
|---|---|---|---|---|---|
| | Syntax element | SI | I | P, SP | B |
| slice_data( ) | mb_skip_flag | | | 11-13 | 24-26 |
| | mb_field_decoding_flag | 70-72 | 70-72 | 70-72 | 70-72 |
| macroblock_layer( ) | mb_type | 0-10 | 3-10 | 14-20 | 27-35 |
| | transform_size_8×8_flag | na | 399-401 | 399-401 | 399-401 |
| | coded_block_pattern (luma) | 73-76 | 73-76 | 73-76 | 73-76 |
| | coded_block_pattern (chroma) | 77-84 | 77-84 | 77-84 | 77-84 |
| | mb_qp_delta | 60-63 | 60-63 | 60-63 | 60-63 |
| mb_pred( ) | prev_intra4×4_pred_mode_flag | 68 | 68 | 68 | 68 |
| | rem_intra4×4_pred_mode | 69 | 69 | 69 | 69 |
| | prev_intra8×8_pred_mode_flag | na | 68 | 68 | 68 |
| | rem_intra8×8_pred_mode | na | 69 | 69 | 69 |
| | intra_chroma_pred_mode | 64-67 | 64-67 | 64-67 | 64-67 |
| mb_pred( ) and | ref_idx_l0 | | | 54-59 | 54-59 |
| sub_mb_pred( ) | ref_idx_l1 | | | | 54-59 |
| | mvd_l0[ ][ ][0] | | | 40-46 | 40-46 |
| | mvd_l1[ ][ ][0] | | | | 40-46 |
| | mvd_l0[ ][ ][1] | | | 47-53 | 47-53 |
| | mvd_l1[ ][ ][1] | | | | 47-53 |
| sub_mb_pred( ) | sub_mb_type | | | 21-23 | 36-39 |
| residual_block_cabac( ) | coded_block_flag | 85-104 | 85-104 | 85-104 | 85-104 |
| | significant_coeff_flag[ ] | 105-165 | 105-165 | 105-165 | 105-165 |
| | | 277-337 | 277-337 | 277-337 | 277-337 |
| | | | | 402-416 | 402-416 |
| | | | | 436-450 | 436-450 |
| | last_significant_coeff_flag[ ] | 166-226 | 166-226 | 166-226 | 166-226 |
| | | 338-398 | 338-398 | 338-398 | 338-398 |
| | | | | 417-425 | 417-425 |
| | | | | 451-459 | 451-459 |
| | coeff_abs_level_minus1[ ] | 227-275 | 227-275 | 227-275 | 227-275 |
| | | | | 426-435 | 426-435 |

As known from Table 2, ctxIdx can receive 460 values from 0 to 459. In one syntax element, selection of ctxIdx varies depending on the slice type. For example, as ctxIdx of mb_field_decoding flag is 70-72 in slice type I, when determining the value of ctxIdx for the syntax element having a plurality of values of ctxIdx, it is determined by the operation of ctxIdx=ctxIdxOffset+ctxIdxInc, on the basis of the values of offset value ctxIdxOffset and increment value ctxIdxInc. ctxIdxOffset is an intrinsic value of syntax element shown in Table 3 (partly excerpted from the table of H.264 standard), and ctxIdxInc is uniformly determined from a plurality of values according to the rule determined in every syntax element (see the H.264 standard) In the case of mb_field_decoding_flag, ctxIdxOffset is 70, and any value from 0 to 2 is selected as ctxIdxInc depending on the condition.

The context calculating circuit 520 initializes and stores the occurrence probability information by calculation shown in FIG. 23 in every 460 values of ctxIdx at the time of start of slice. The occurrence probability information includes a set of MPS (valMPS) showing the symbol of higher occurrence probability of binary symbols 0 and 1, and pState (pStateIdx) showing the occurrence probability. The occurrence probability information corresponding to the determined value of ctxIdx is called the "context information".

The context calculating circuit 520 generates the context information, and inputs into the arithmetic coding circuit 140. Thus, depending on the syntax element for arithmetic coding, the occurrence probability of the symbol to be entered in the arithmetic coding circuit 140, that is, the context information is changed over adaptively. As a result, in the binary symbol sequence dynamically changing in the occurrence probability of binary symbols, an optimum arithmetic coding is realized. Herein, the total bit length of output codes occurring at the time of process of multivalued input data in a specific section is called the "code amount."

Concept of operation of the arithmetic coding circuit 140 is explained by referring to FIGS. 24A and 24B. Suppose binary sequences of {0, 0.0, 1} are supplied in the condition in which ctxIdx is constant at a certain value, and the occurrence probability obtained from the context information is 0.75 (0.11 in binary notation) for symbol 0, and 0.25 for symbol 1. In this case, as shown in FIG. 24 A, the present context information is expressed by MPS=0 showing the symbol of higher occurrence probability, and occurrence probability pState=0.11. Indeed, the actual pStateIdx is expressed by an index value in a range from 0 to 63, but a binary probability value is used herein for the sake of simplicity. The context information is updated by this binary arithmetic coding, and is returned to the context calculating circuit 520. In the context calculating circuit 520, the occurrence probability information of the corresponding ctxIdx is updated. This value is utilized again in the next coding process of the same ctxIdx.

Referring now to FIG. 24B, when a first input binary value "0" is entered, the section of [0, 1] is narrowed to the 0 side divided by probability 0.11, and becomes [0, 0.11]. When a second input "0" is entered, the section of [0, 0.11] is narrowed to [0, 0.1001]. Herein, 0.1001=0.11×0.11. Similarly, by a third input "0", the section becomes [0, 0.011011]. When a fourth input "1" is entered, the section is narrowed to the 1 side, and the final section is narrowed to [0.01010001, 0.011011]. Of the values contained in this final section, the one having the shortest word length is the code word. That is, since 0.011 is contained in this section, the value "011" below the decimal point is an output binary sequence, and the four-bit input value is compressed to 3 bits.

In actual operation of the arithmetic coding circuit 140, since this section is handled by the finite word length, the output bit is established depending on the values of codILow and codIRange in which the left end value of the section is codILow (0.01010001, etc.), the section range is codIRange (0.00011011, etc.), and codIRange and codILow are shifted by 1 bit to the left, and the resolution of the section is enhanced, which is called renormalization. The actual 1-bit arithmetic coding process is executed according to the flowcharts shown in FIG. 25 and FIG. 26.

FIG. 25 shows the arithmetic coding process (820) of one binary (Bin) input, consisting of initialization of a variable (821), judging whether Bin is MPS or not (822), updating of codILow and codIRange if not MPS (823), judging the value of pStateIdx (824), inverting of MPS (825), updating of occurrence probability pStateIdx (826, 827), and renormalization (830). FIG. 25 shows the process of renormalization 830.

In FIG. 25 and FIG. 26, codIRange and codILow are internal state variables, and are initialized only at the beginning of a slice. Right after coding of the 4-bit input value shown in FIG. 24B, when coding an input value different in ctxIdx, only the context information is changed, and the values right after 4-bit coding are used for codIRange and codILow. In the case of arithmetic coding of conversion coefficient data, multivalued input data different in ctxIdx are continuously coded, such as significant_coeff_flag of luminance 64 coefficient, coeff_abs_level_minus1 of luminance 64 coefficient, significant_coeff_flag of color difference DC component, and coeff_abs_level_minus1 of color difference AC component, and the internal state is initialized only at the beginning of a slice; therefore, all syntax elements including them must be coded sequentially only within the slice, and cannot be processed in parallel.

On the other hand, in moving image coding, since input images having various characteristics are compressed at a specified bit rate, it is required to control the code amount by properly controlling the quantization parameter when coding each macro block. To enhance the precision of code amount control, it is general to code repeatedly by changing the parameters in the unit such as slice, frame, or GOP (group of pictures). The repeated coding includes two types of coding, provisional coding mainly for predicting the code amount, and final coding.

Conventional provisional coding methods are roughly classified into actual entropy coding same as in final coding, and substitute operation without performing entropy coding. The former method in the conventional coder generally uses the variable length coding for entropy coding. Recently, arithmetic coding is proposed for entropy coding. As mentioned above, arithmetic coding is coding process in bit unit, and it is sequential coding in a slice, and if arithmetic coding is applied in provisional coding, a tremendous code amount is required. Hence, in a circuit in which the real-time processing is required, it is quite difficult to apply arithmetic coding in provisional coding.

Accordingly, as provisional coding method when arithmetic coding is applied in final coding method, the latter method is proposed (substitute operation for entropy coding). For example, as disclosed in patent document 1, without performing arithmetic coding, the input binary symbol amount is used as the prediction value of output code amount, and the processing amount when selecting the optimum coding mode can be saved. Patent document 2 proposes a method of prediction by using functions.

Patent document 1: JP-A-2005-318296
Patent document 2: JP-A-2005-203905
Non-patent document 1: ISO/IEC14496-10 Advanced video coding for generic audiovisual services

DISCLOSURE OF INVENTION

Problems to be Solved by the Invention

In the coder using arithmetic coding, however, the code amount cannot be predicted precisely in the conventional system performing provisional coding without arithmetic coding.

That is, in the system proposed in patent document 1, the function operates somewhat satisfactorily as relative comparison between a plurality of coding modes, but since arithmetic coding is not performed, the prediction value of code amount cannot be calculated precisely. In the system proposed in patent document 2, since it is completely different from the operation of arithmetic coding, the code amount cannot be predicted accurately.

The invention is conceived in the light of such problems, and it is hence a primary object thereof to present a coder using arithmetic coding, and more particularly a code amount predicting method of high precision substantially shortened in the processing time in the circuit while approximate operation is performed in the arithmetic coding.

Means for Solving the Problems

In the invention, in provisional coding, the binary symbol sequence is divided into a plurality of groups based on the context, and the predicted code amount is determined by approximating the arithmetic code amount in parallel on the binary symbol sequence classified into groups.

More specifically, the coder of the invention includes a blocking circuit for generating multivalued data in specified coding unit (for example, macro block), having a plurality of contexts, from an input signal, a binarizing circuit for converting the multivalued data generated by the blocking circuit into a binary symbol sequence, an arithmetic code amount approximating circuit for calculating the prediction code amount in the coding unit from the binary symbol sequence, and a coding circuit for coding the input signal arithmetically on the basis of the prediction code amount, in which the arithmetic code amount approximating circuit includes a selector for dividing the binary symbol sequence contained in the specified coding unit into a plurality of groups based on the contexts, a plurality of code amount approximating circuits, each of which is a circuit provided in each group, for calculating, from the binary symbol sequence divided into a plurality of groups, the prediction code amount of the group based on at least the section range in arithmetic coding, and an adder for adding the prediction code amounts from all code amount approximating circuits, and outputting the prediction code amount in the specified coding unit.

Effects of the Invention

According to the invention, in the coder using arithmetic coding, approximate calculation of arithmetic coding of a plurality of groups divided according to the contexts can be executed in parallel, and by operation similar to arithmetic coding, the processing time can be saved substantially as compared with arithmetic coding. As a result, by using a circuit suppressed in operation frequency, a coder based on coding value prediction at high precision is realized. The invention also presents a video coder of high image quality.

BRIEF DESCRIPTION OF DRAWINGS

FIG. 4 is a diagram showing syntax elements to be processed in the arithmetic code amount approximating circuit.

FIG. 10A and FIG. 10B are explanatory diagrams of fraction code amount table.

FIG. 13 is an explanatory diagram of an integer code amount table.

FIG. 14 is an explanatory diagram of initialization of an integer code amount table.

FIG. 18A and FIG. 18B are diagrams of selection example of provisional quantization parameter.

FIG. 19A, FIG. 19B, and FIG. 19C are diagrams of selection example of provisional quantization parameter.

FIG. 20A and FIG. 20B are diagrams of an example of data accumulated in a code amount integrating memory.

FIG. 23 is an explanatory diagram of initialization of occurrence probability information.

FIG. 24A and FIG. 24B explanatory diagrams of concept of arithmetic coding.

DESCRIPTION OF THE REFERENCE NUMERALS

Figure 1:
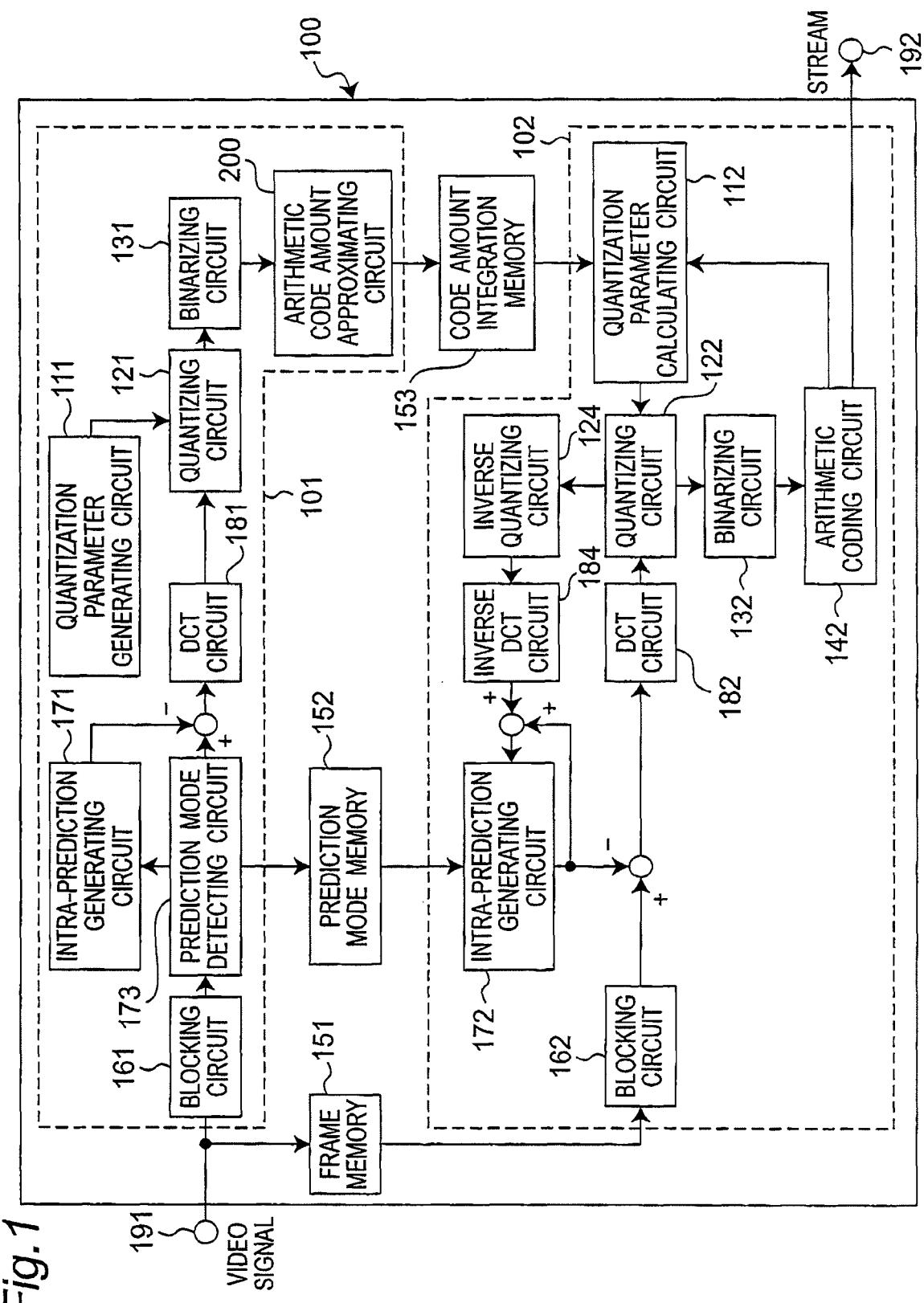
FIG. 1 is a configuration diagram of a video coder.

100 Video coder
101 First coding circuit
102 Second coding circuit
111 Quantization parameter generating circuit
112 Quantization parameter calculating circuit
121 First quantizing circuit
122 Second quantizing circuit
124 Inverse quantizing circuit
131 First binarizing circuit
132 Second binarizing circuit
142 Arithmetic coding circuit
151 Frame memory
152 Prediction mode memory
153 Code amount integration memory
161 First blocking circuit
162 Second blocking circuit 171 First intra-prediction generating circuit
172 Second intra-prediction generating circuit
173 Prediction mode detecting circuit
181 First DCT circuit
182 Second DCT circuit
184 Inverse DCT circuit
191 Video signal input
192 Output bit stream/E
200 Arithmetic code amount approximating circuit
211 to 214 Arithmetic code amount approximating circuit
230 Selector
231 Adder

BEST MODE FOR CARRYING OUT THE INVENTION

An embodiment of the invention is described below while referring to the accompanying drawings, 1. Configuration of Video Coder This embodiment relates to a video coder for coding intra-frames that can be decoded within a frame, and controlling the code amount based on the code amount prediction of high precision by using a circuit in which operation frequency is suppressed low.

FIG. 1 shows a configuration of a video coder in an embodiment of the invention. In FIG. 1, a video coder 100 includes a first coding circuit 101 for coding provisionally, a second coding circuit 102 for coding finally, a frame memory 151, a prediction mode memory 152, and a code amount integration memory 153.

The first coding circuit 101 includes a first blocking circuit 161 for dividing an input signal into blocks, a prediction mode detecting circuit 173, a first intra-prediction generating circuit 171, a first DCT circuit 181 as orthogonal converting circuit, a quantization parameter generating circuit 111, a first quantizing circuit 121, a first binarizing circuit 131, and an arithmetic code amount approximating circuit 200.

The second coding circuit 102 includes a second blocking circuit 162, a second intra-prediction generating means 172, a second DCT circuit 182, a quantization parameter calculating circuit 112, a second quantizing circuit 122, a second binarizing circuit 132, an arithmetic coding circuit 142, an inverse quantizing circuit 124, and an inverse DCT circuit 184.

In the video coder having the configuration as explained above, its operation is explained.

2. Operation of Video Coder

The video coder receives and processes video signals 191 in frame unit. The following explanation refers to a flow of process of video signals of one frame for the sake of simplicity.

When digital video signals 191 of one frame are entered in the video coder 100, the first coding circuit 101 provisionally codes the entered digital video signals of one frame. In this provisional coding, the prediction mode value detected by prediction mode detecting circuit 173 is stored in the prediction mode memory 152, and the code amount output from the arithmetic code amount approximating circuit 200 is stored in the code amount integration memory 153.

The digital video signals 191 entered in the video coder 100 are stored in the frame memory 151, and delayed by a specified time in one frame, and are sent into the second coding circuit 102. The second coding circuit 102 codes the digital video signals of one frame, and outputs an obtained stream 192. In coding by the second coding circuit 102, the prediction mode value stored in the prediction mode memory 152, and the code amount stored in the code amount integration memory 153 are entered, and the same frame is coded. The specific process in the first and second coding circuits 101, 102 is described below.

2.1 Provisional Coding by First Coding Circuit

The provisional coding process of the first coding circuit 101 is explained.

The blocking circuit 161 receives digital video signals 191, and divides the video signal of one frame into a plurality of macro blocks composed of 16×16 pixels. The macro block includes a plurality of blocks as units of DCT or intra-prediction as described below.

The intra-prediction generating circuit 171 predicts the values of pixels of the macro block in various prediction modes (intra-prediction), from the pixels of entered digital video signals, and pixels adjacent to pixels of entered digital video signals 191 in every 16×16 pixel macro block. The intra-prediction may be executed in the unit of 8×8 pixel block or 4×4 pixel block, instead of macro block units.

The prediction mode detecting circuit 173 detects the prediction mode value from the entered digital video signals 191. The prediction mode value includes field macro block decoding flag (mb_field_decoding_flag), luminance 4×4 intra-prediction mode (Intra4×4PredMode), luminance 8×8 intra-prediction mode (Intra8×8PredMode), and color difference intra-prediction mode (intra_chroma_pred_mode). The detected prediction mode values are accumulated in the prediction mode memory 152.

In the entered digital video signal 191, the difference of each pixel value of macro block to be coded, and the pixel prediction value of the macro block to be coded generated in the intra-prediction generating circuit 171 is calculated, and a block of differential value of 16×16 pixels is generated, and output into the DCT circuit 181. The intra-prediction may be executed in the unit of 8×8 pixel block or 4×4 pixel block, instead of macro block units.

The DCT circuit 181 processes the block of differential value by orthogonal transformation such as DCT (discrete cosine transform). This processing is carried out usually in the block unit of 4×4 pixels or 8×8 pixels, and the coefficient data of frequency component is output. The coefficient data is put into the quantizing circuit 121, and is quantized according to the quantization parameter given from the quantization parameter generating circuit 111. The quantization parameter is selected and determined from the plurality of parameter candidates by the quantization parameter generating circuit 111.

The coefficient data quantized by the quantizing circuit 121 is binarized in the binarizing circuit 131. The arithmetic code amount approximating circuit 200 determines and outputs the prediction code amount from the binarized coefficient data. The prediction code amount output from the arithmetic code amount approximating circuit 200 is recorded in the code amount integration memory 153.

2.1.1 Operation of Arithmetic Code Amount Approximating Circuit

Figure 2:
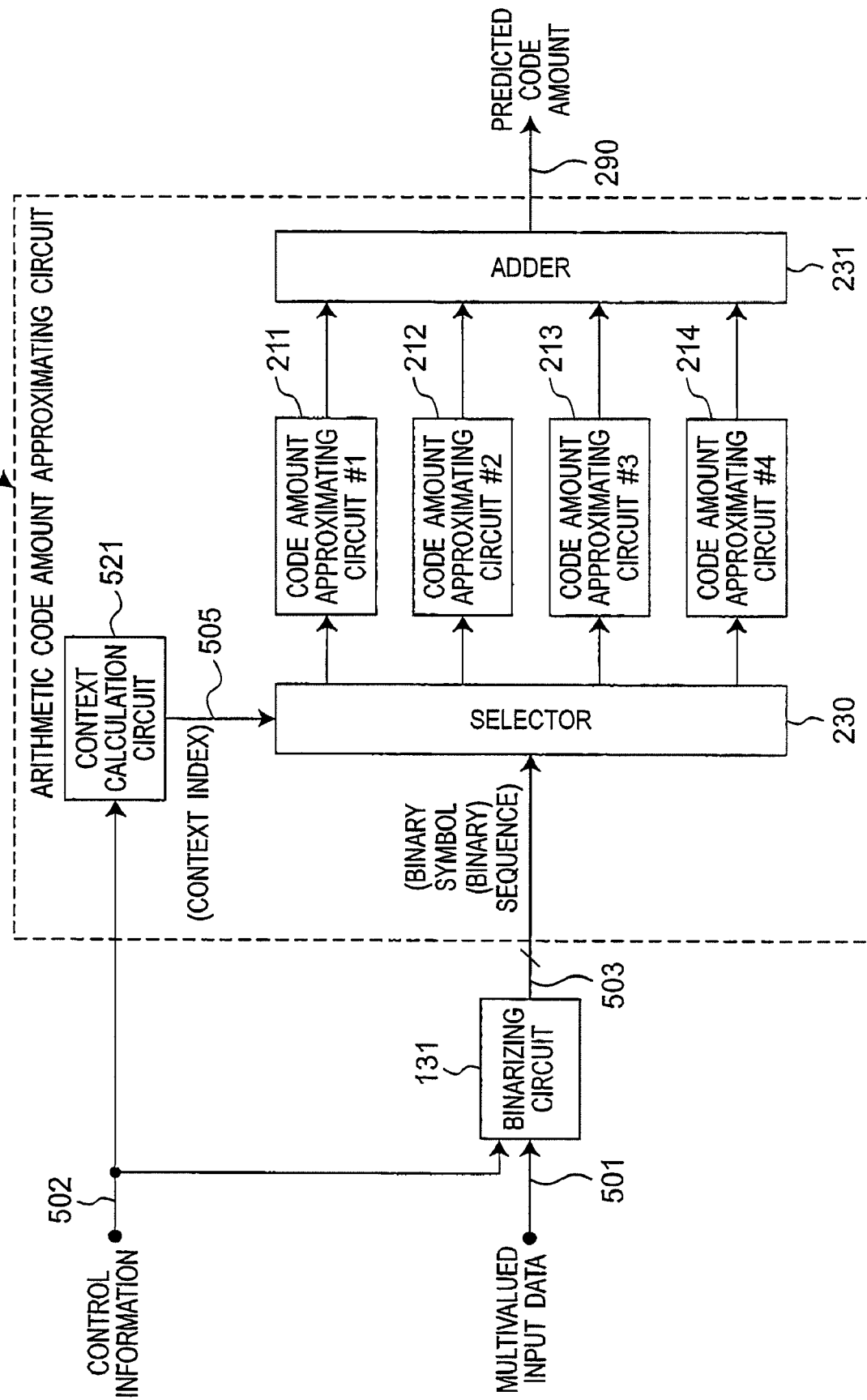
FIG. 2 is a configuration diagram of an arithmetic code amount approximating circuit.

The arithmetic code amount approximating circuit 200 operates similarly to arithmetic coding, and determines a prediction code amount in every macro block, that is, an approximate value of code amount of arithmetic coding. FIG. 2 shows a configuration of the arithmetic code amount approximating circuit 200. The arithmetic code amount approximating circuit 200 includes a context calculating circuit 521, a selector 230, first to fourth code amount approximating circuits 211 to 214, and an adder 231. The first to fourth code amount approximating circuits 211 to 214 are selected depending on the value of context index (ctxIdx).

In the arithmetic code amount approximating circuit 200 having such configuration, the operation is described below.

Figure 22:
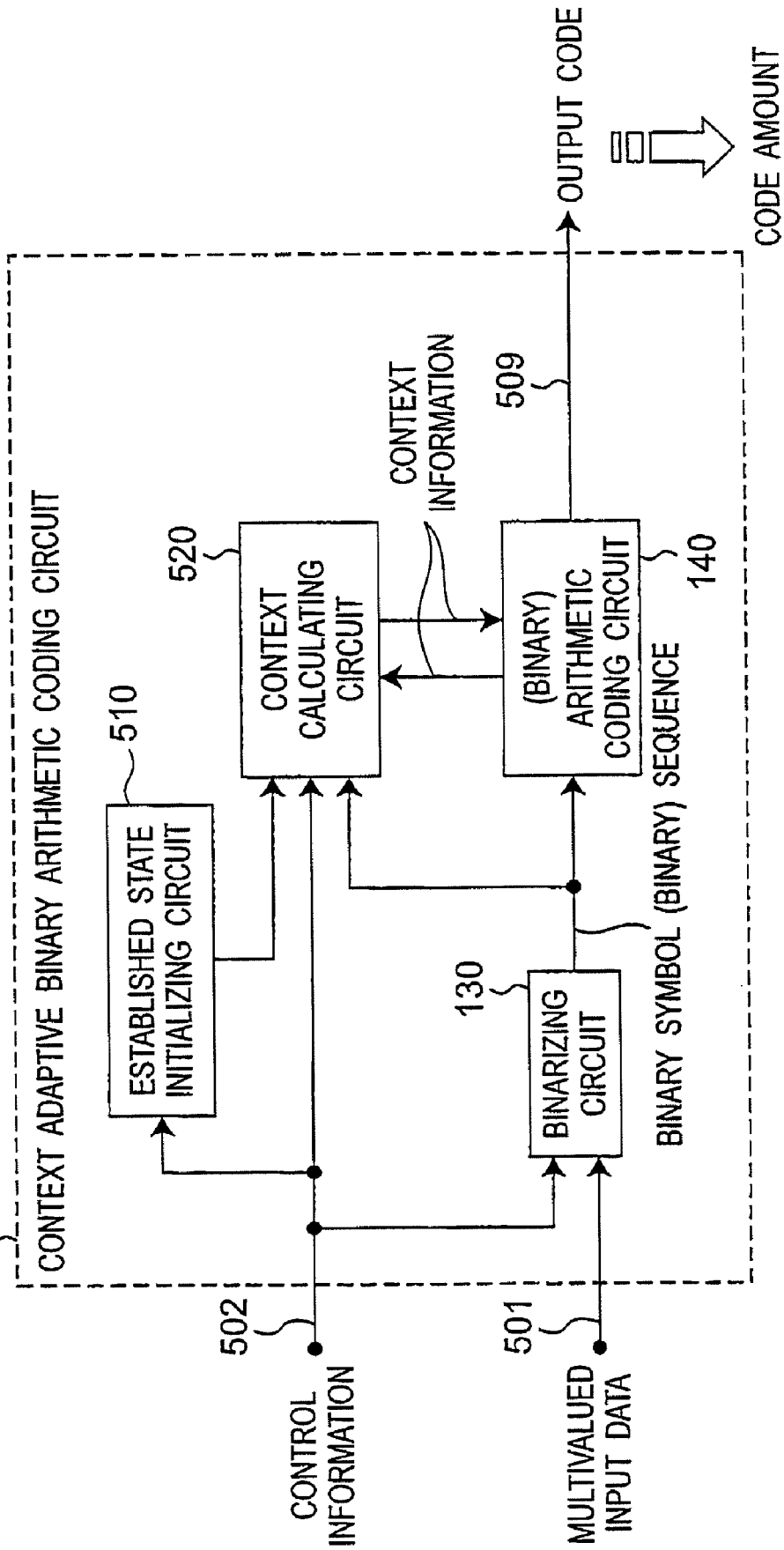
FIG. 22 is an explanatory diagram of a conventional context adaptive arithmetic coding circuit.

The multivalued input data 501 is converted into binary symbol (binary) sequence 503 in the binarizing circuit 130. The binarizing circuit 131 is basically a same circuit as the binarizing circuit 130 included in the context adaptive arithmetic coding circuit 145 in FIG. 22, but the binary symbol sequence 503 may not be always a serial output, and may be a parallel output. The context calculating circuit 521 outputs the present context index (ctxIdx) 505 to the selector 230 on the basis of the control information 502 entered simultaneously with the multivalued input data 501. The selector 230 distributes the present binary symbol 503 to any one of the first to fourth code amount approximating circuits 211 to 214 on the basis of the context index (ctxIdx) 505. The binary symbols are distributed so that the first and second code amount approximating circuits 211, 212 may process the data about the luminance, and that the third to fourth code amount approximating circuits 213, 214 may process the data relating to the color difference.

Figure 3:
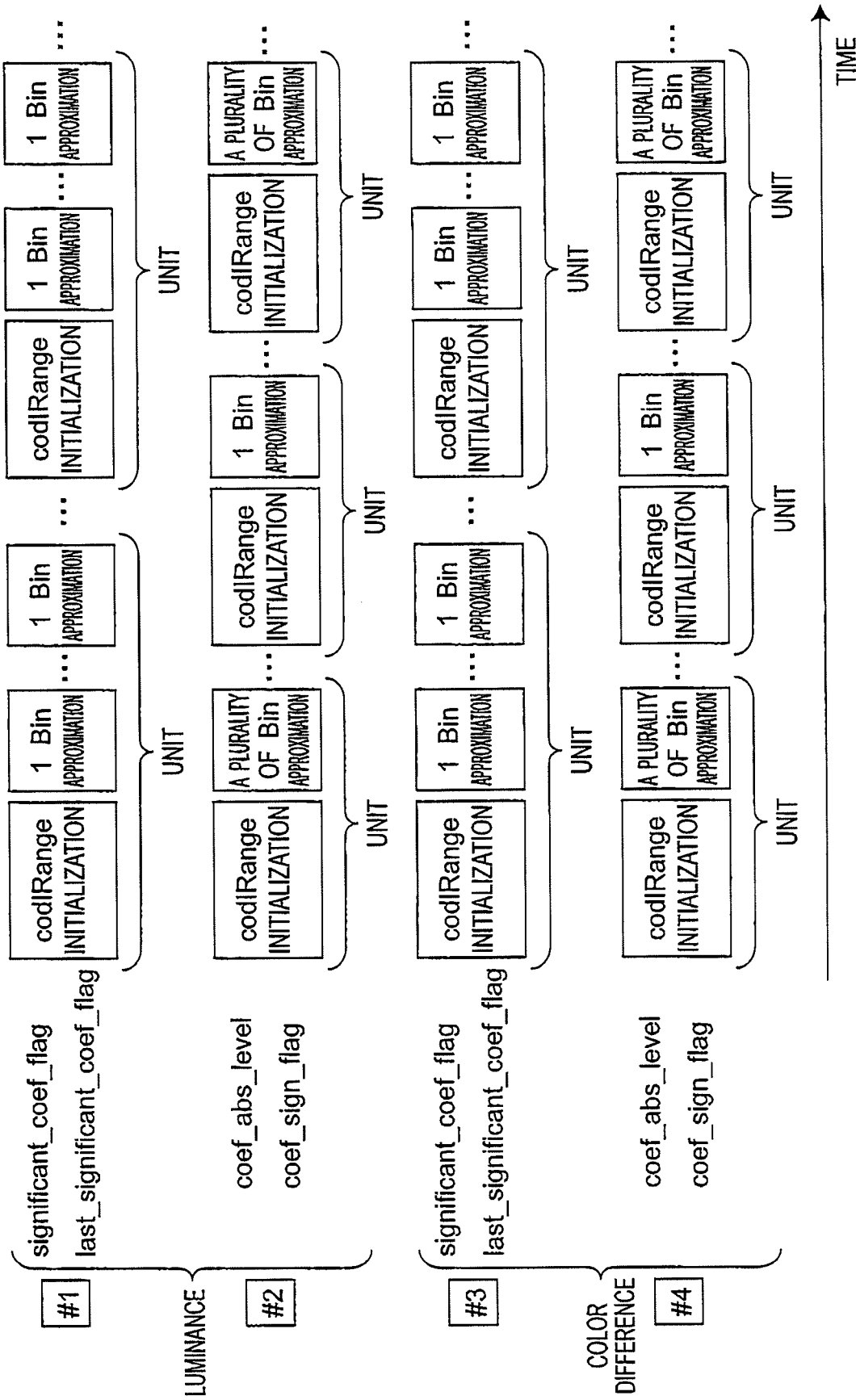
FIG. 3 is an explanatory diagram of parallel processing in the arithmetic code amount approximating circuit.

In the arithmetic code amount approximating circuit 200, to execute the code amount approximating process simultaneously in the first to fourth code amount approximating circuits 211 to 214, parallel processing is realized as shown in FIG. 3, and the processing time for approximating the code amount can be shortened.

Distribution of binary symbols 503 among the code amount approximating circuits 211 to 214 on the basis of the context index (ctxIdx) is explained more specifically by referring to FIG. 4.

FIG. 4 is a diagram explaining the correspondence between ctxIdx and the first to fourth code amount approximating circuits 211 to 214 to be assigned, relating to the syntax element belonging to residual_block_cabac( ) in Table 1. As known from the diagram, for example, if ctxIdx=402, it belongs to significant_coeff_flag of luminance, and the first code amount approximating circuit 211 is selected. Although coeff_sign_flag is not shown in Table 1 because it is bypassed in arithmetic coding, it is handled as bypass in code amount approximating circuits, and is used in approximation of code amount.

The code amounts thus calculated in the code amount approximating circuits 211 to 214 are added in the adder 231, and output as prediction code amount 290 in every specific section.

Figure 5:
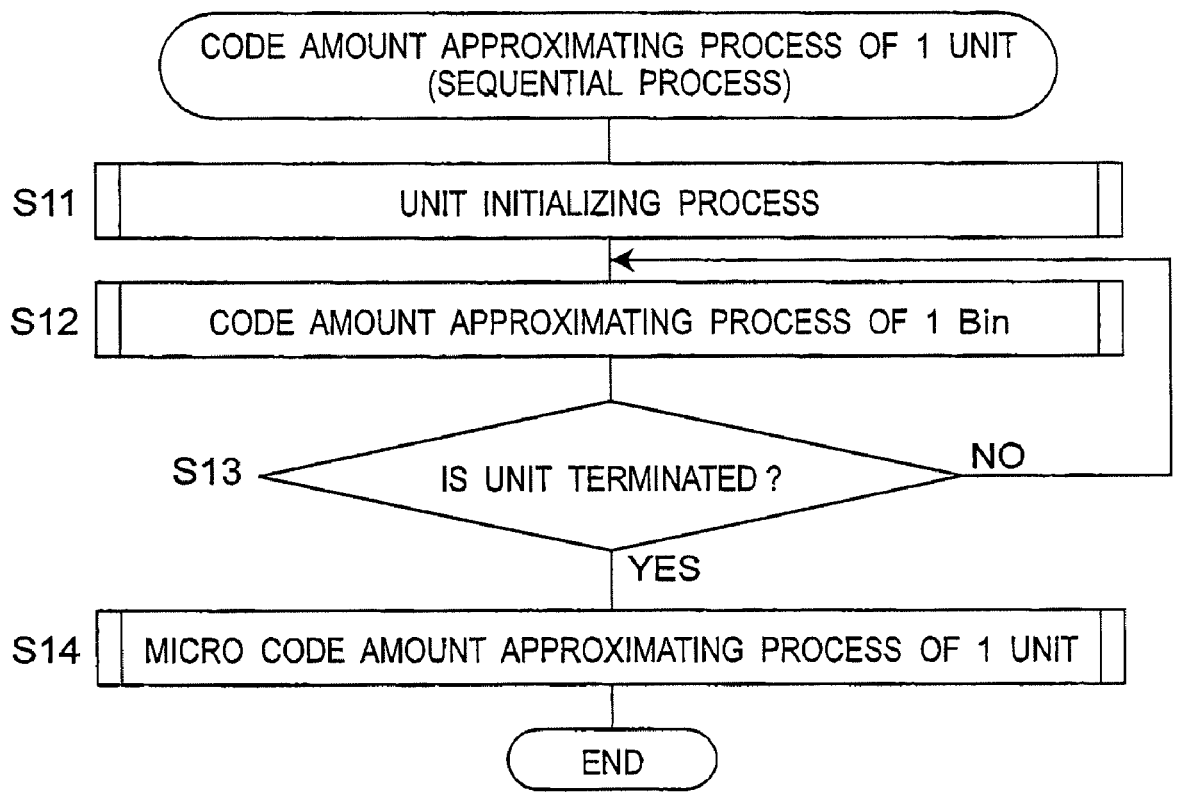
FIG. 5 is a flowchart of code amount approximating process of 1 unit in sequential process.
Figure 11:
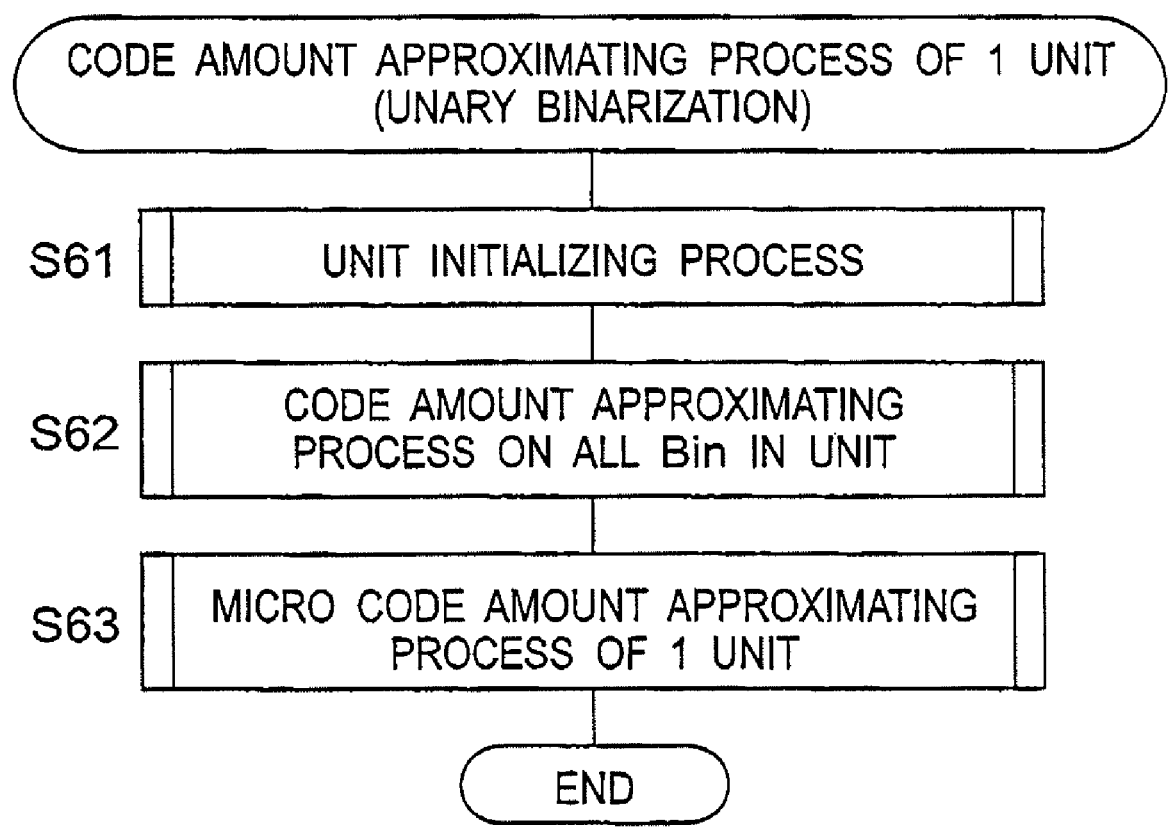
FIG. 11 is a flowchart of code amount approximating process of 1 unit in unary binalization.
Figure 15:
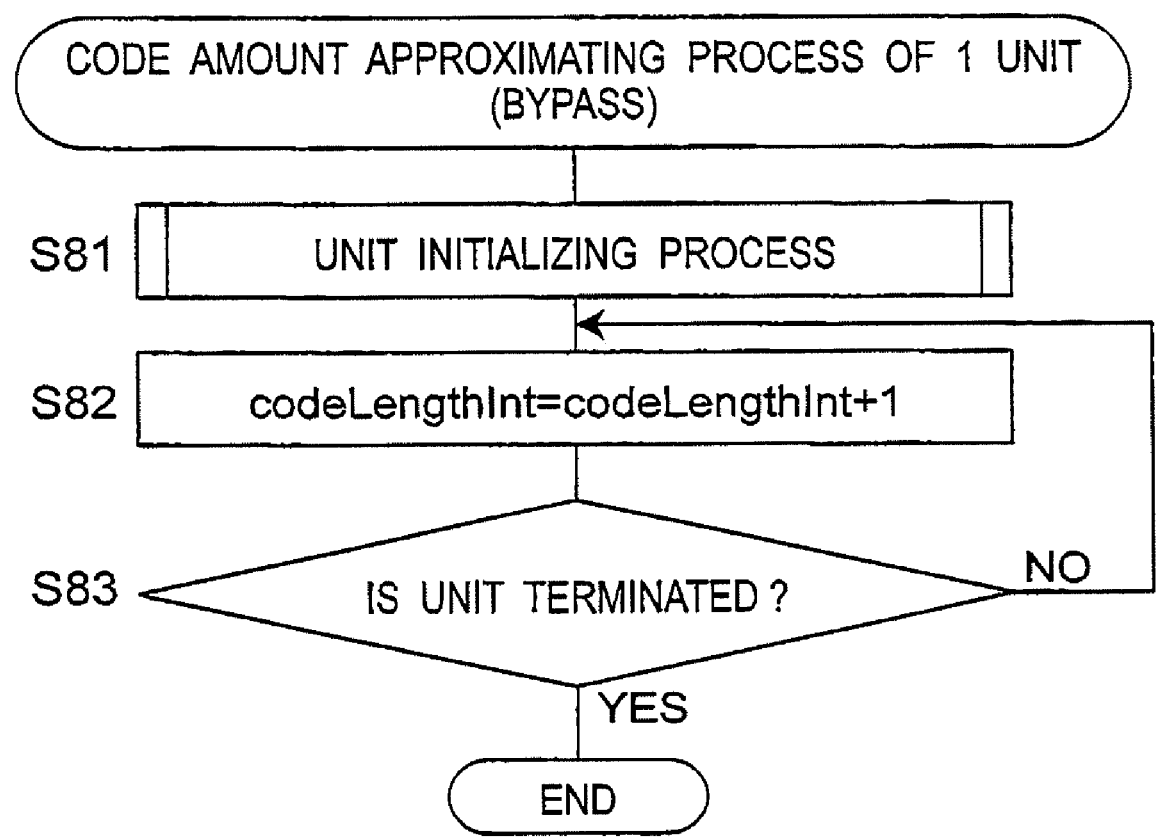
FIG. 15 is a flowchart of code amount approximating process of 1 unit in bypass.

Processing executed in the code amount approximating circuits 211 to 214 consists of three processes as shown in flowcharts in FIG. 5, FIG. 11, and FIG. 15. The process shown in FIG. 11 is applied in syntax element using unary binarization in binary processing such as coeff_abs_level_minus1. The process shown in FIG. 5 shows the sequential process applied to an ordinary syntax element not applied in the process of FIG. 11. The process shown in FIG. 15 is the process applied in the binary symbol (hereinafter, referred to as "Bin") handled as bypass as mentioned above. The processes in FIG. 5, FIG. 11, and FIG. 15 are executed in every unit. The unit is a set of binary symbols (Bin), and is determined in a set of Bin in which the values of ordinary ctxIdx are continuously the same.

(a) Arithmetic Code Amount Approximating Process by Sequential Process

Referring now to FIG. 5 to FIG. 9, the code amount approximating process by sequential process is explained. FIG. 5 shows a flowchart of code amount approximating process of 1 unit by sequential process. In this code amount approximating process, first (upon start of the unit), unit initializing process (S11) is executed, and code amount approximating process of 1 Bin (S12) is repeated until the unit is terminated (S13), finally (at the end of the unit) micro code amount approximating process of 1 unit is executed (S14), and the process is terminated.

Figure 6:
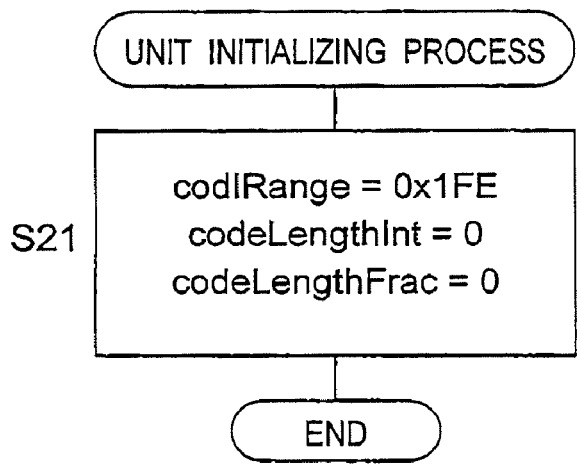
FIG. 6 is a flowchart of unit initializing process.

Referring to FIG. 6, the detail of unit initializing process at step S11 is explained. In the unit initializing process, the width of a section (codIRange), the integer portion of unit code amount (or integer code amount) (codeLengthInt), and the fractional portion of unit code amount (or fraction coding unit) (codeLengthFrac) are individually initialized (S21). The unit code amount is divided thus into the integer portion and the fractional portion, and the code amount is approximated at the precision of decimal fraction. That is, codeLengthFrac expresses the portion below the decimal point at 9-bit precision, and ranges in values from 0 to 511.

Figure 7:
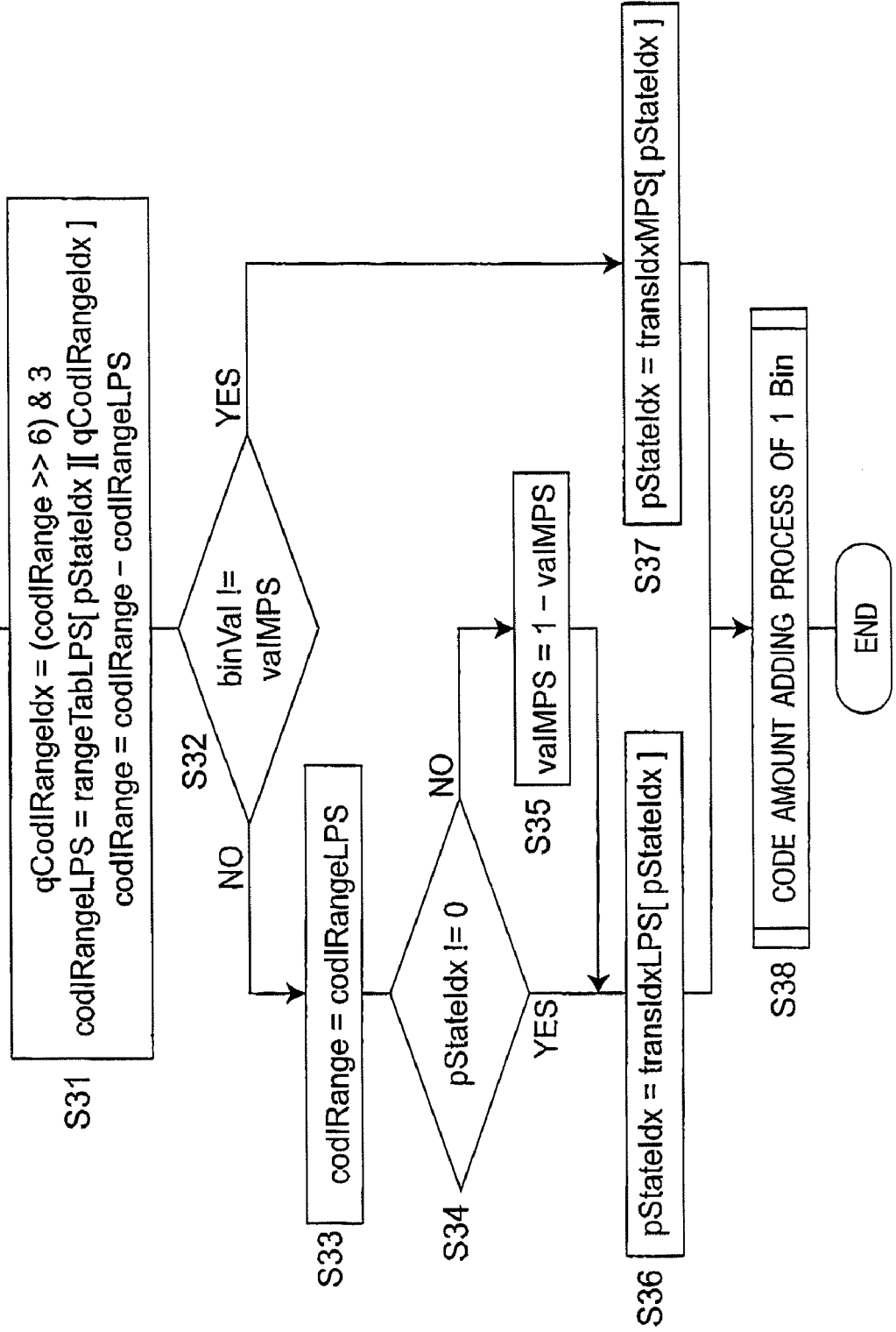
FIG. 7 is a flowchart of code amount approximating process of 1 Bin.
Figure 25:
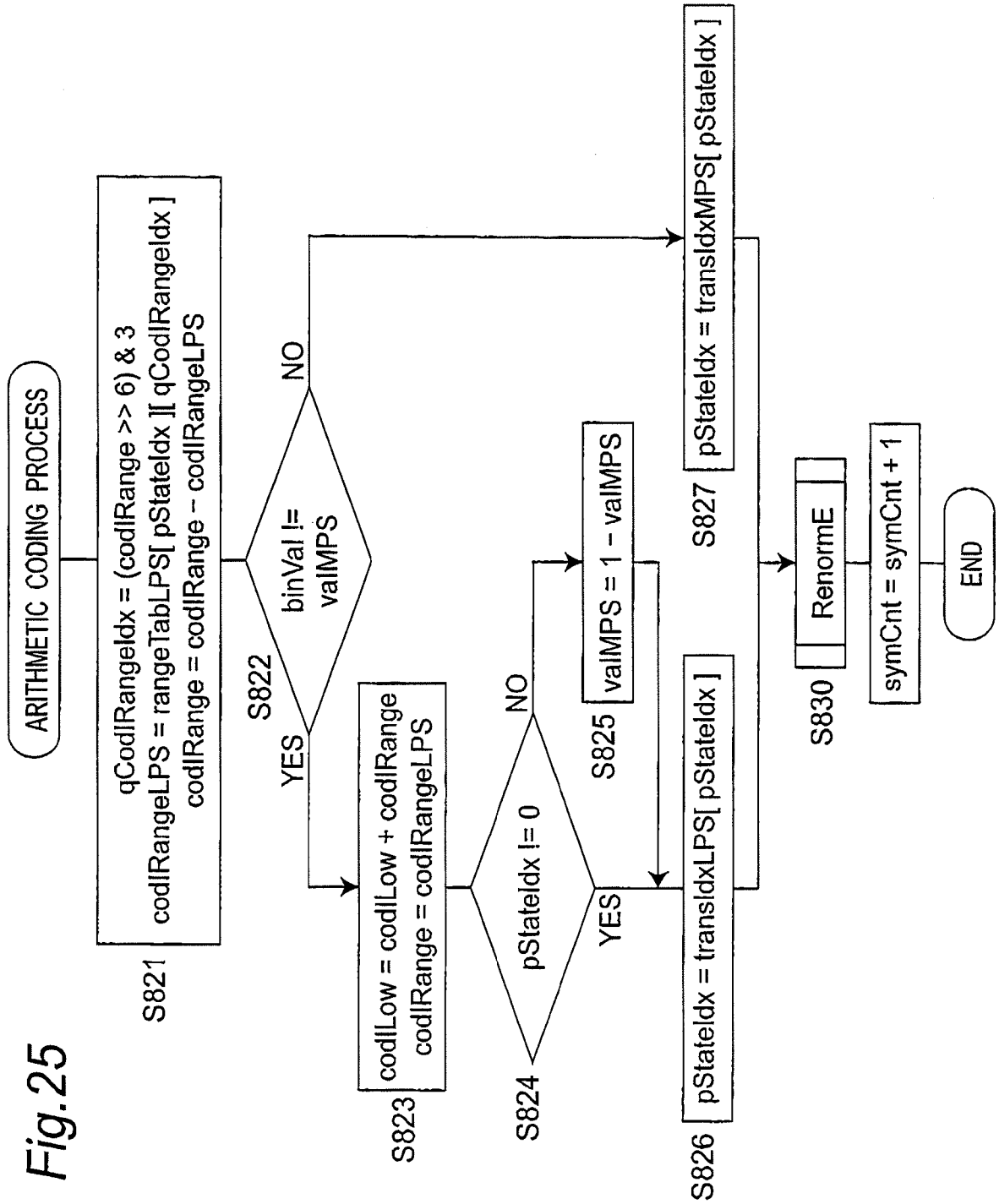
FIG. 25 is a flowchart of arithmetic coding process on input of 1 Bin.

Referring to FIG. 7, the detail of code amount approximating process of 1 Bin at step S12 is explained. In the code amount approximating process of 1 Bin, first, the variable is initialized (S31). Next, it is judged if Bin is MPS or not (S32). If Bin is not MPS, codIRange is updated (S33), and the value of pStateIdx is judged (S34). If the value of pStateIdx is 0, the MPS is inverted (S35), and the occurrence probability pStateIdx is updated (S36). If Bin is MPS at step S32, only updating of pStateIdx is executed (S37). Finally, the process is terminated by executing the code amount adding process of 1 Bin (S38). The flowchart in FIG. 7 is similar to the flowchart of arithmetic coding process shown in FIG. 25, except that codILow is not calculated at step S33, and that the code amount adding process of 1 Bin (S38) is executed instead of step (S830) of renormalization in FIG. 25.

Figure 8:
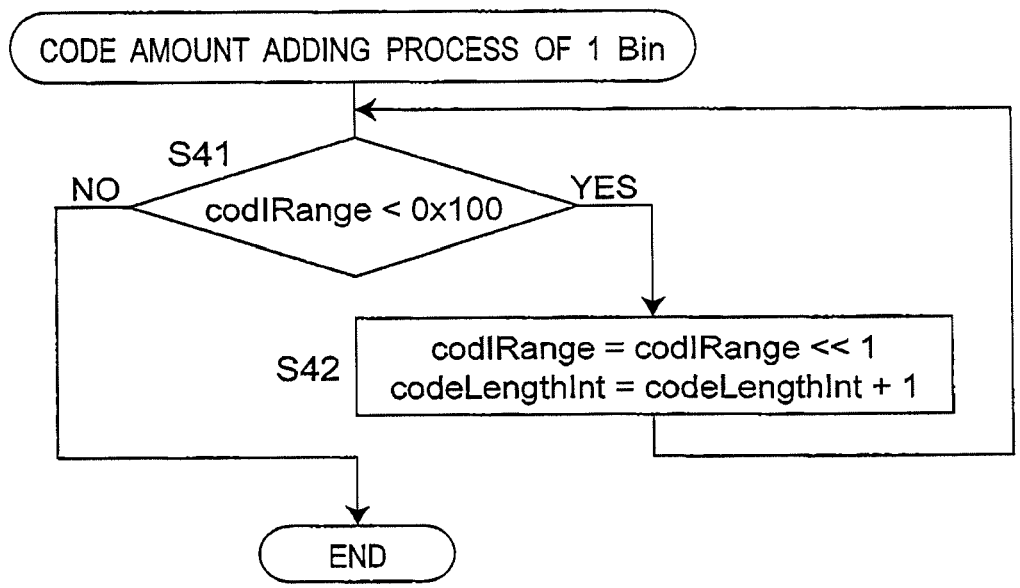
FIG. 8 is a flowchart of code amount approximating process of 1 Bin.
Figure 26:
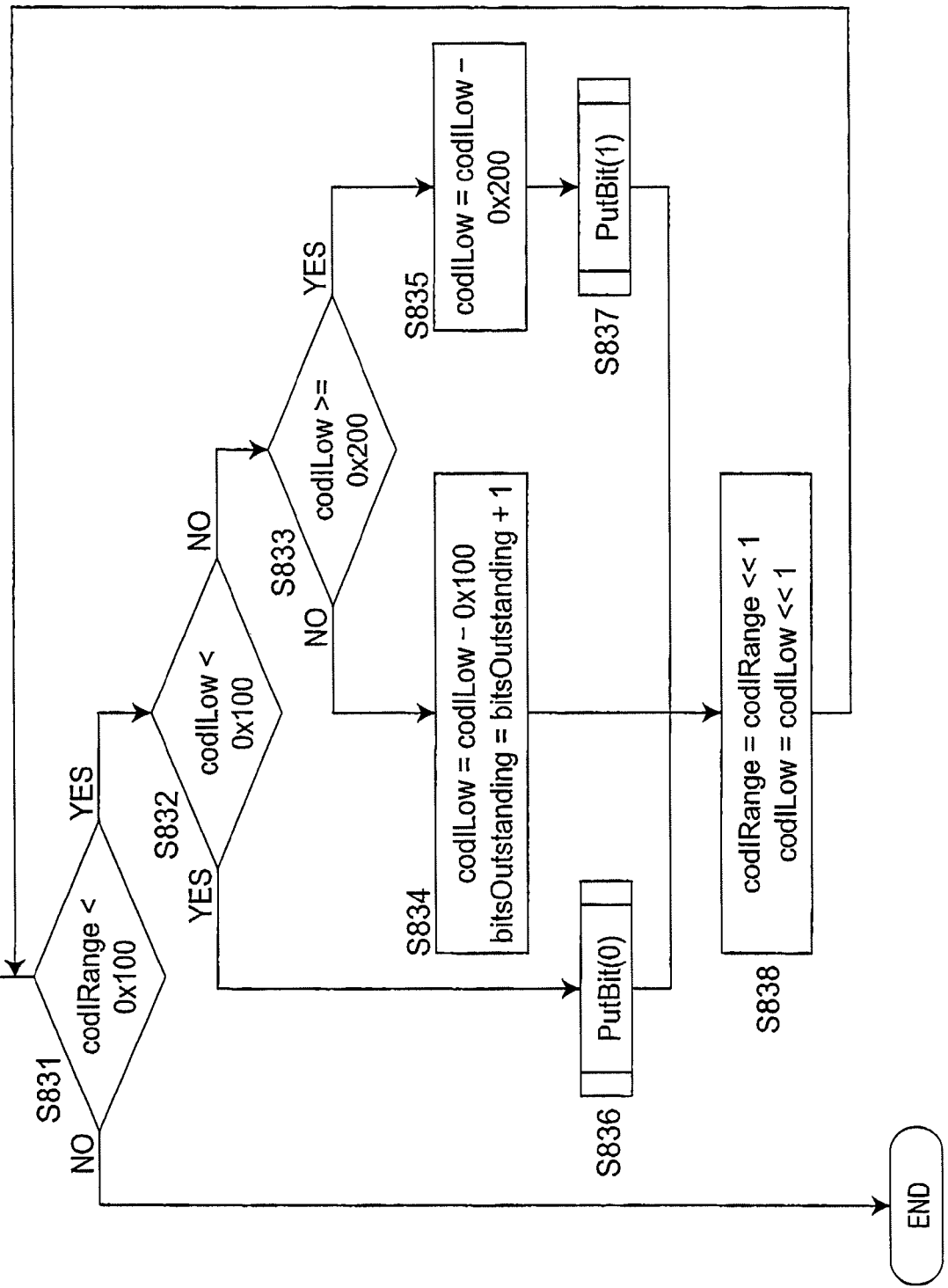
FIG. 26 is a flowchart of renormalization process.

Referring to FIG. 8, the detail of code amount adding process of 1 Bin at step S38 is explained. In the code amount adding process of 1 Bin, the process of adding 1 to the integer portion codeLengthInt of unit code amount is repeated by shifting codIRange by 1 bit to the left until codIRange becomes 0x100 or more (S41, S42). The flowchart in FIG. 8 is similar to the flowchart of renormalization in FIG. 26, except that only the portion of operating codIRange is extracted, and that the number of times of left shift of codIRange is added to the code amount.

Figure 9:
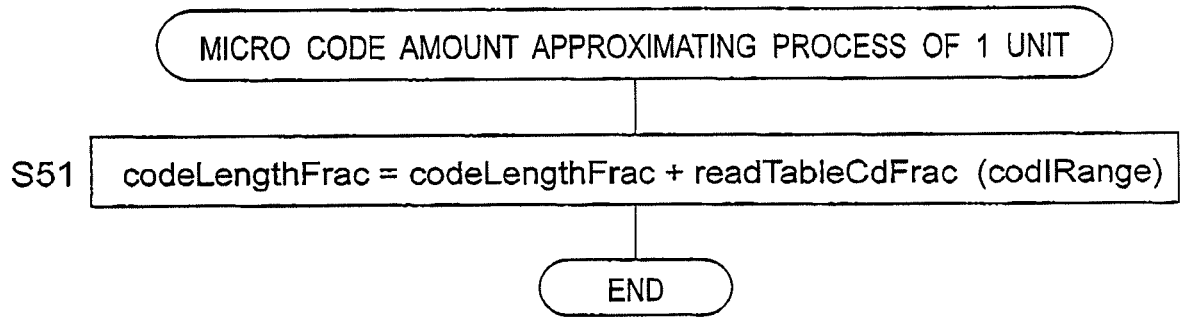
FIG. 9 is a flowchart of micro code amount approximating process of 1 unit.

Referring to FIG. 9, the operation of micro code amount approximating process of 1 unit at step S14 is explained. In the micro code amount approximating process of 1 unit shown in FIG. 9, the fractional portion codeLengthFrac of the unit code amount is determined by the table reference function readTableCdFrac( ) (S51). FIGS. 10A and 10B show the table reference function readTableCdFrac( ). The fraction code amount table mTbl is composed of 256 constants (see FIG. 10A). The fraction code amount table mTbl is initialized by the function initTableCdFrac( ) (see FIG. 10B). The fraction code amount table mTbl is a logarithmic table in which mTbl [0]=511, and mTbl [255]=1. At the time of codIRange=256, mTbl [0] is 511, and at the time of codIRange=511, mTbl [255] is 1. Conceptually, the closer is the codIRange to 512, the more frequently appears the MPS relatively, and the fraction code amount is shorter. The closer is the codIRange to 256, the more frequently appears the LPS relatively, and the fraction code amount is longer. This relation is approximated at high precision by the logarithmic curve shown in the formula of initTableCdFrac( ).

(b) Code Amount Approximating Process on Syntax Element Using Unary Binarization Referring to FIG. 11, the following is the explanation about code amount approximating process on syntax element using unary binarization.

In the code amount approximating process using unary binarization shown in FIG. 11, first, the unit initializing process is executed (S61), and the code amount approximating process on all Bin in the unit (S62) is executed, finally the micro code amount approximating process of 1 unit (S63) is executed, and the process is terminated. The code amount approximating process of 1 unit shown in FIG. 11 is similar to the code amount approximating process of 1 unit of sequential process in FIG. 5, except that the repeated process of the step of code amount approximating process of 1 Bin (S12) is replaced by the code amount approximating process on all Bin in the unit (S62).

This is an explanation of syntax element applying the code amount approximating process of unary binarization shown in FIG. 11 as an example of coeff_abs_level_minus1. This coeff_abs_level_minus1 is different in ctxIdx depending on the position binIdx of Bin shown in Table 1. Accordingly, except for binIdx=0, the Bin in a range of $1 \leq \text{binIdx} \leq 13$ is handled as 1 unit. That is, the subject is that the column of "Value of syntax element" in Table 1 is 1 or more to 14 or less. The maximum value is 14 because of the truncated type in which the maximum value binIdx=13 terminates with code "1". When the number of codes "1" after binIdx=1 is expressed by variable run_length, the value of run_length is 0 or more to 13 or less. Since it is the bypass if binIdx=14 or more, in this example, the code amount approximating process of unary binarization is applied to all coefficients of which value of coeff_abs_level_minus1 is 1 or more, except for the bypass portion.

Figure 12:
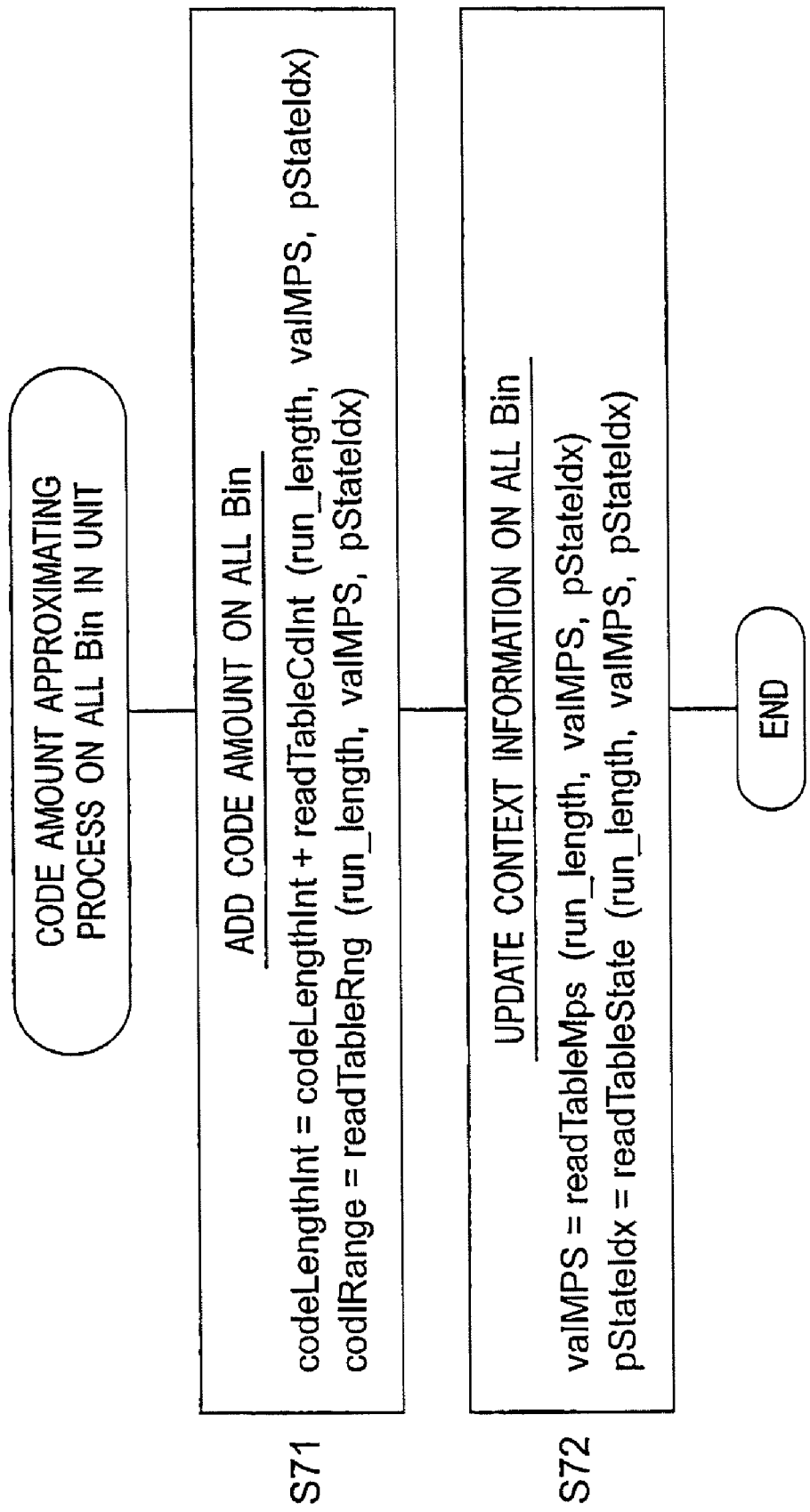
FIG. 12 is a flowchart of code amount approximating process on all Bin in a unit.

Referring to FIG. 12, the detail of code amount approximating process on all Bin in the unit at step S62 is explained. First, the code amount is added to all Bin (S71). In this process, the integer portion codeLengthInt of the unit code amount is added by using table reference function readTableCdInt( ), and the codIRange is updated by using table reference function readTableRng( ). The context information of all Bin is updated (S72). In this process, valMPS is updated by using table reference function readTableMps( ), and pStateIdx is updated by using table reference function readTableState( ).

Referring to FIG. 13, each table reference function is explained. As shown in FIG. 13, since the maximum value of the bit is 13, it is defined that MAX_RUN=13. The table reference functions readTableCdInt( ), readTableRng( ), readTableMps( ), and readTableState( ) returns the values by referring respectively to integer code amount table (mCdlIntTbl), range table (mRngTbl), MPS table (mMpsTbl), and pState table (mStateTbl). These tables receive all coding patterns and all occurrence probability patterns of binary symbol sequences.

Referring to FIG. 14, the detail of initializing process of each table is explained. All of integer code amount table (mCdlIntTbl), range table (mRngTbl), MPS table (mMpsTbl), and pState table (mStateTbl) are initialized by executing the initialization function initTableCdInt( ) on every run_length, valMPS, and pStateIdx. This initializing process conforms to the operation of code amount approximating process of 1 unit by sequential process shown in FIG. 5. In FIG. 14, Proc1Bin (binVal, &valMPS, &pStateIdx) corresponds to the code amount approximating process (S12) of 1 Bin in FIG. 5, and binVal, valMPS, pStateIdx, and codIRange are processed equivalently to the process in FIG. 7. However, the code amount adding process of 1 Bin (S38) in FIG. 7 is executed by "while" process at two positions in FIG. 14. Hence, the tables are initialized so that the integer portions of the code amount on all Bin can be calculated in batch.

(c) Arithmetic Code Amount Approximating Process on Bin Handled as Bypass

Referring to FIG. 15, the detail of code amount approximating process of 1 unit on Bin handled as bypass is explained. In this code amount approximating process, after the unit initializing process (S81), the integer portion codeLengthInt of the unit code amount is added 1 by 1 until the end of the unit (S82, S83). That is, in this code amount approximating process, the code amount of 1 Bin is counted as merely the code amount of 1 bit.

The adder 231 shown in FIG. 2 calculates the prediction code amount as follows from the approximate value of the unit code amount obtained by three code amount approximating processes shown in FIG. 5, FIG. 11, and FIG. 15.

In all units included in the macro block, the integer portion (codeLengthInt) of unit code amount and fractional portion (codeLengthFrac) of unit code amount output from all code amount approximating circuits 211 to 214 are added respectively, and the integer portion of macro block prediction code amount (MBcodeLengthInt) and fractional portion of macro block prediction code amount (MBcodeLengthFrac) are calculated. The prediction code amount MBcodeLength of final macro block is determined in the following formula.

$$MB\text{codeLength}=MB\text{codeLengthInt}+(MB\text{codeLengthFrac}>>9) \quad (1)$$

The code amount approximating processes of 1 unit described above (see FIG. 5, FIG. 11, FIG. 15) are can be processed in parallel in every unit, and the reason is explained below.

As mentioned above, two internal states codIRange and codILow were hindrance to parallel processing of context adaptive arithmetic coding process, but codIRange is initialized to a fixed value in every unit by unit initializing process shown in FIG. 6, and codILow does not exist in the entire process shown in FIG. 5 to FIG. 15. Hence, the code amount approximating process of each unit can be executed in parallel in time on the circuit as shown in FIG. 3.

As explained in FIG. 11, meanwhile, in the code amount approximating process of 1 unit (unary binarization), a plurality of Bin can be processed in batch. This is possible by preparing a code group of unary binarization of a specified range, and a table based on combination of all valMPS and all pStateIdx.

The condition for approximating the code amount of the macro block at high precision by the arithmetic code amount approximating circuit 200 is explained.

The condition is that the rate of the generated code amount of the generated code amount of the entire macro block by ctxIdx covered by the entire code amount approximating circuits (total of #1 to #4) is close to 100% as shown in FIG. 4, when the code amount approximating processes of 1 unit shown in FIG. 5, FIG. 11 and FIG. 15 are applied to the first to fourth code amount approximating circuits 211 to 214. In the example shown in FIG. 4, the syntax element used in code amount approximating process is selected in the preliminary condition that the generated code amount of the syntax element belonging to residual_block_cabac( ) is close to 100% of the generated code amount of the entire macro block. If the generated code amount occupied by other syntax elements cannot be ignored, such syntax elements must be also the object of code amount approximating process.

Figure 16:
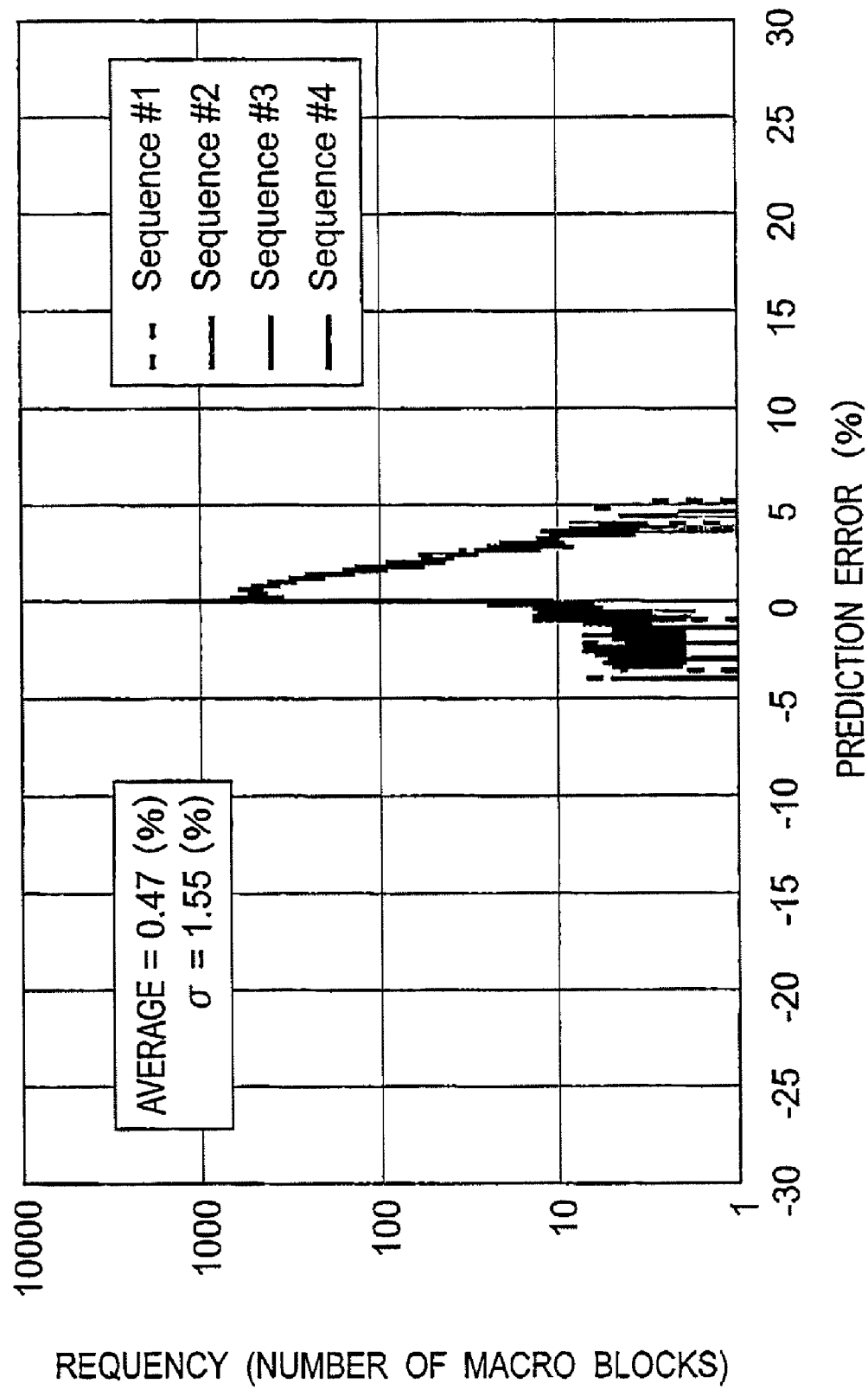
FIG. 16 is a diagram of prediction precision of an arithmetic code amount approximating circuit.

FIG. 16 shows the precision of prediction of prediction code amount 290 by the arithmetic code amount approximating circuit 200 according to the embodiment. In FIG. 16, the rate of error of prediction code amount of macro block unit and the generated code amount by arithmetic coding is plotted over 1 frame (8160 macro blocks). The error exists in four types of frames different in statistic characteristics (sequence #1 to #4), in which the average is 0.47% and the standard deviation is 1.55%, and a high precision is obtained.

2.2 Final Coding by Second Coding Circuit

The operation of coding by the second coding circuit 102 in FIG. 1 is explained. When provisional coding of one frame is finished by the first coding circuit 101, the video signals of one frame accumulated in the frame memory 151 are put into the blocking circuit 162. The pixel values of the macro block to be coded are compared with the pixel prediction values generated by the intra-prediction generating circuit 172 on the basis of the prediction mode values read out from the prediction mode memory 152, and the differential value is calculated. The block of the differential value is processed by DCT in the DCT circuit 182, and the coefficient data of frequency component is output. The coefficient data is input into the quantizing circuit 122, and is quantized. At this time, the quantization parameter is calculated in the quantization parameter calculating circuit 112. The quantized coefficient data is converted into a binary symbol in the binarizing circuit 132, and is coded in the arithmetic coding circuit 142, and is output as a bit stream 192.

2.3 Setting of Quantization Parameter in Provisional Coding in First Coding Circuit 101

Figure 17A:
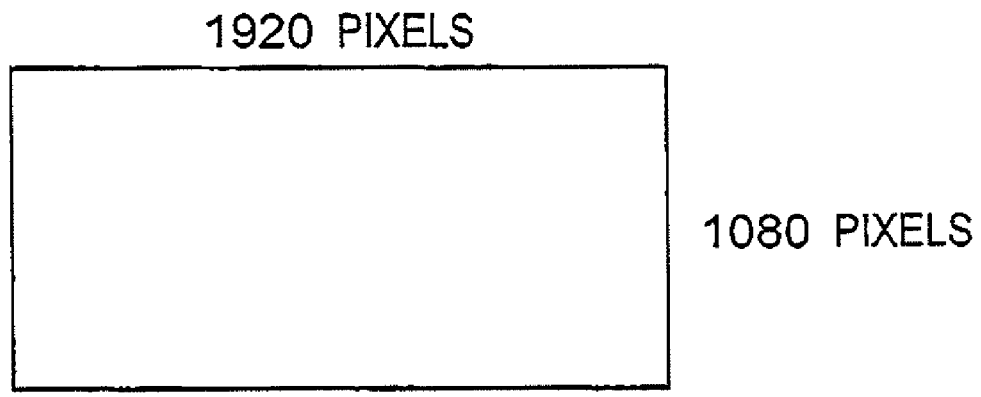
FIG. 17A is a diagram of one frame composed of 1920× 1080 pixels.

A specific example of provisional coding in the first coding circuit 101 is explained in FIG. 17A, in which an optimum quantization parameter is calculated in the slice unit in coding of 1 frame of 1920×1080 pixels.

Figure 17B:
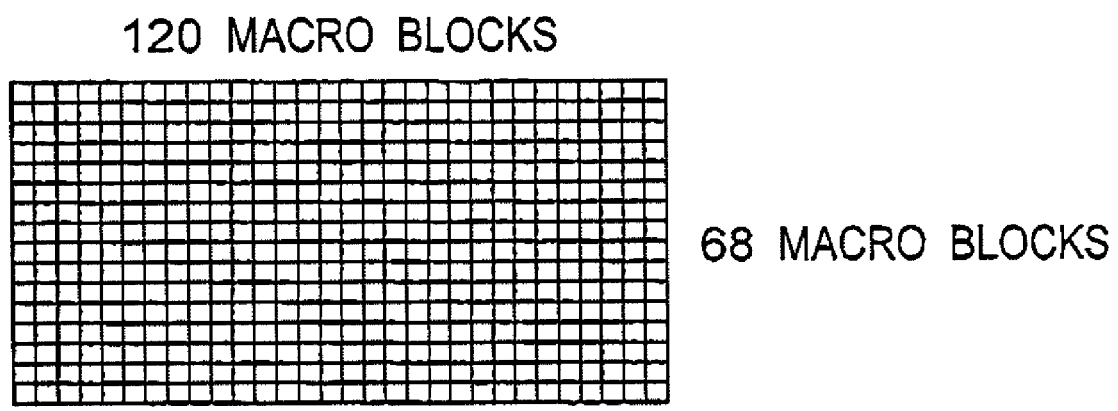
FIG. 17B is a diagram of one frame composed of 120×68 macro blocks.

As shown in FIG. 17B, the frame of 1920×1080 pixels is composed of 8160 (=120×68) macro blocks of 16×16 pixels. The slice for dividing the frame may be defined as a set of arbitrary continuous macro blocks, and suppose, for example, one slice contains 2040 macro blocks, while one frame is composed of 4 slices in this case, it may be set as N=Nmb=2040 (=8160/4).

Before start of provisional coding, provisional quantization parameter $QP_1(n)$ to be used in the quantizing circuit 121 of the first coding circuit 101 is determined. The provisional quantization parameter is determined by selecting one from a plurality of candidates in every macro block. That is, the provisional quantization parameter $QP_1(n)$ for one macro block can be determined by selecting one from arbitrary different Q types of representative quantization parameters $qp_1(x)$ (x=0, 1, ..., Q-1), and setting it to the provisional quantization parameter $QP_1(n)$ for the macro block.

For example, suppose to give two types [0 and 20] of representative parameters $qp_1(x)$=0, 20. Herein, the notation of $F(x)=\{A_0, A_1, ..., A_{Q-1}\}$ ($A_n$ being an integer) means $F(0)=A_0, F(1)=A_1, ..., F(Q-1)=A_{Q-1}$. The provisional quantization parameter of each macro block is selected from two types of representative quantization parameters so as to equalize the occurrence frequency of each provisional quantization parameter. In this example, the quantization parameter 0 is given to a half of macro blocks, and the quantization parameter 20 is given to other half of macro blocks. To prevent deviation of provisional quantization parameters within the slice, the provisional parameters are disposed alternately or randomly in the slice. For example, in progressive scanning, as shown in FIG. 18A, provisional quantization parameters are given alternately in the ordinary raster scan order, and in interlace scanning, provisional quantization parameters are given alternately in every pair of macro blocks as shown in FIG. 18B.

Referring now to FIGS. 19A-19C, this is to explain the method of determining the type Q of representative quantization parameter $qp_1(x)$ in provisional coding, and its value $qp_1(x)$ (x=0, 1, ..., Q-1).

The type Q of representative quantization parameter used in the quantizing circuit 121 is defined as a divisor of 2040 (number of macro blocks contained in one slice), or when macro blocks are paired for coding for interlace scanning, it may be defined as a divisor of its half or 1020. When the type Q of representative quantization parameter is determined in this manner, the number of times of occurrence of an arbitrary representative quantization parameter within a slice can be set constant. For example, in the case of progressive scanning, Q can be selected from 5, 10, 20 as a divisor of 2040. In the case of each Q, the number of times of occurrence of each representative parameter in one slice is 408 times, 204 times, and 102 times, respectively.

As the representative quantization parameter $qp_1(x)$, Q different values are selected from the range of quantization parameters that can be selected by the encoder. In this case, for the ease of code amount prediction for optimum coding, it is preferred to distribute the values appropriately. For example, when the number of macro blocks contained in one slice is 2040, and the quantization parameters that can be selected by the encoder are in a range of 0 to 51, as shown in FIG. 19A, Q=10, $pq_1(x)$={0, 4, 8, 12, 16, 22, 28, 34, 42, 51} may be selected as the representative quantization parameter $qp_1$. At this time, in the case of progressive scanning, the provisional quantization parameter as shown in FIG. 19B is applied, or in the case of interlace scanning, the provisional quantization parameter as shown in FIG. 19C is applied. The representative quantization parameter preferably contains the maximum value and minimum value of the quantization parameter.

The following is the explanation about the data accumulated in the code amount integration memory 153 as the result of provisional coding in the first coding circuit 101. In provisional coding, in one slice including N=2040 macro blocks, in every macro block using the same representative quantization parameter $qp_1(x)$, the sum of prediction code amounts $R_1(n)$ output from the arithmetic code amount approximating circuit 200 is calculated. This sum is accumulated in the code amount integration memory 153 as prediction code amount $r_1(x)$ of every QP. In the example shown in FIGS. 20A and 20B, in each one of $qp_1(x)$={0, 4, 8, 12, 16, 22, 28, 34, 42, 51} (x=0, 1, ..., 9), the sum of prediction code amounts $R_1(n)$ in every representative quantization parameter, that is, the prediction code amount of every QP, $r_1(x)$={95626, 82252, 64451, 48648, 31785, 19098, 10373, 5439, 2259, 1261} is accumulated in the code amount integration memory 153.

Figure 21:
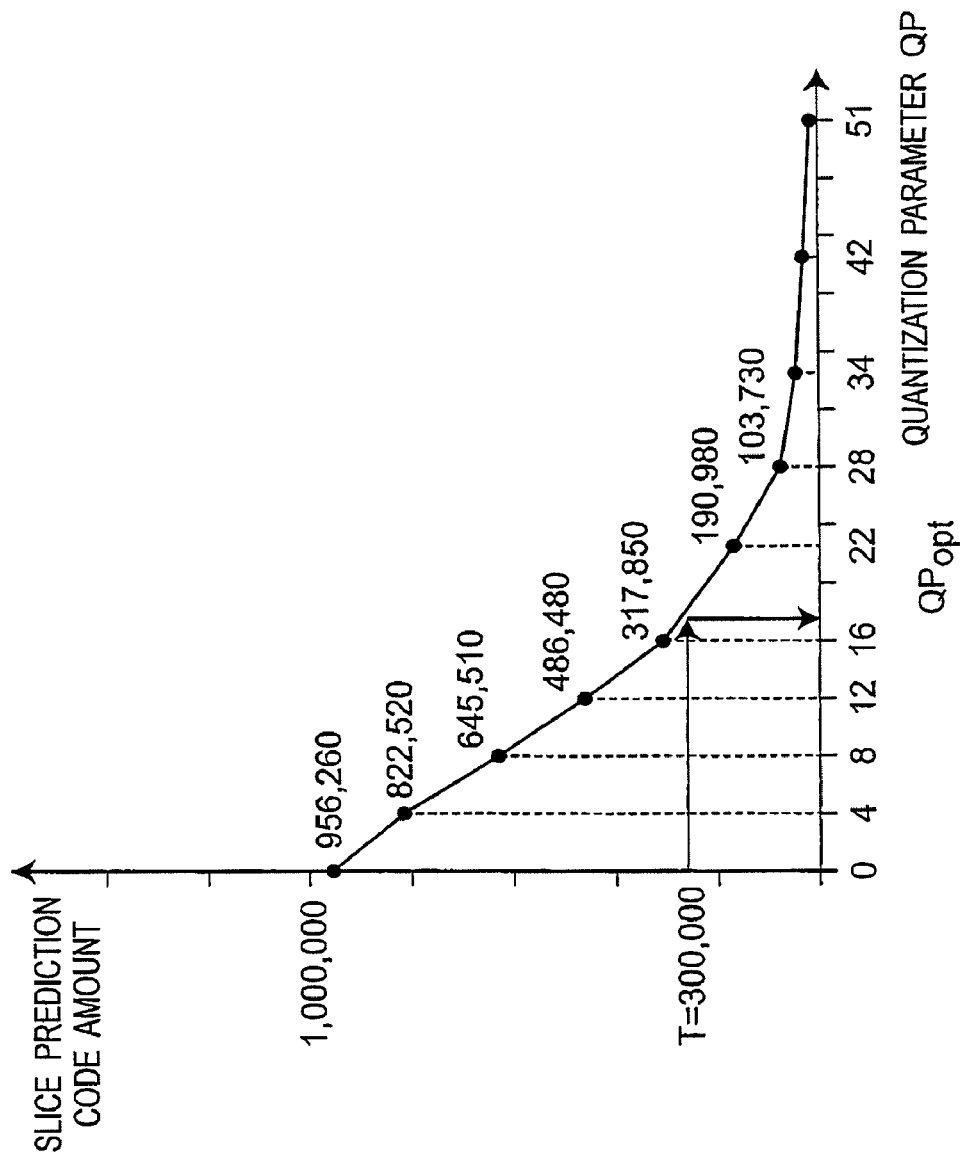
FIG. 21 is an explanatory diagram of calculating method of optimum quantization parameter.

2.4 Calculation of Quantization Parameter in Final Coding in Second Coding Circuit FIG. 21 shows a specific example of calculating the optimum quantization parameter $QP_2(n)$ in final coding in the quantization parameter calculating circuit 112 of the second coding circuit 102. Herein, suppose target code amount T=300,000 bits of slice assigned by using information such as bit rate, frame rate, frame complicatedness, and slice coding type.

From the representative quantization parameter $qp_1(x)$ and every-QP prediction code amount $r_1(x)$, the relation of quantization parameter QP and slice prediction code amount may be plotted on the axes of coordinates as shown in FIG. 21.

That is, $r_1(x)$ is the sum of prediction code amounts of every 204 macro blocks in each one of x=QP, and hence the slice prediction code amount of each QP is determined by multiplying $r_1(x)$ by 10 times. Further, by linear interpolation of plotted slice prediction code amount, a graph of slice prediction code amount on all QP values ($0 \leq QP \leq 51$) can be compiled. By determining the intersection of the slice target code amount T=300,000 and this graph, the optimum quantization parameter $QP_{opt}$ for generating the target code amount can be determined. The value of $QP_{opt}$ can be determined in formula (2) by linear interpolation.

$$QP_{opt}=q+\{QP_1(q+1)-QP_1(q)\}\times\{Q*r_1(q)-T\}/\{Q\times r_1(q)-Q\times r_1(q+1)\} \quad (2)$$

where q is an integer in a range of $0 \leq q \leq Q-1$, satisfying the relation of $Q\times r_1(q+1)$ 5 $T \leq Q\times r_1(q)$. Herein, one optimum quantization parameter is used throughout one slice. If $T>Q\times r_1(q)$ in all q, q is 0, and if $T \leq Q\times r_1(q)$ in all q, q is Q-1.

Since the target code amount T of the slice is 300,000 bits, according to formula (2), $QP_{opt}$ is 16.84.

$$QP_{opt}=16+(22-16)\times(317850-300,000)/(317850-190980)\approx 16.84$$

Since the quantization parameter is an integer, the optimum quantization parameter $QP_{opt}$ is 17. Depending on the amount below the decimal point, the smaller side value of 16 may be selected.

Thus, the optimum quantization parameter $QP_2(n)=QP_{opt}$ can be calculated. Besides, by using $QP_{opt}$ as initial value for coding of N macro blocks, the subsequent quantization parameters can be changed dynamically.

As explained herein, by using the arithmetic code amount approximating circuit 200 of the embodiment, the output stream 192 in the video coder can be obtained.

In the example explained above, the arithmetic code amount approximating circuit 200 is composed by assuming the syntax element contained in residual_block_cabac( ) in Table 2, but all other syntax elements may be assumed such as mb_pred( ) or macroblock_layer( ). In this case, basically, the range of the intended ctxIdx may be extended as shown in FIG. 4.

3. Modified Examples

The foregoing embodiment relates to the configuration of the arithmetic code amount approximating circuit 200 for coding the intra-frame only, but it is also applicable when coding the P-frame or B-frame of prediction between frames. In the P-frame or B-frame, the code amount necessary for motion vector is increased, and syntax elements contained in mb_pred( ) or sub_mb_pred( ) in Table 2 may be added as the object of processing.

In the embodiment, as shown in FIG. 2, four code amount approximating circuits are used, but the number of code amount approximating circuits is not particularly specified. In the example of unary binarization, batch processing without using sequential process of Bin is explained, but evidently the concept of the embodiment can be applied also to the binary coding method other than unary binarization. The table of integer portion and the table of fractional portion are explained separately, but the tables can be integrated on the basis of the codIRange value.

In the embodiment, N is the number of macro blocks contained in the slice unit. But by coding provisionally or coding in a smaller unit, the prediction code amount $R_2(n)$ may be obtained from the arithmetic code amount approximating circuit 200, and the result may be reflected in selection of provisional quantization parameter, and in such a case, the value of N may be set at a smaller value conforming to the coding unit. The value of N is fixed in the explanation, but may be changed dynamically in the frame unit or other unit. The graph of slice prediction code amount is determined by linear interpolation, but may be also determined by spline interpolation or more advanced numerical interpolation.

In the embodiment, provisional coding is processed only once, but may be executed plural times if real-time coding is not required, or more processes can be executed in a specific delay by pipeline or parallel processing of provisional coding.

The bit stream coded by using the embodiment can be recorded in various recording media such as tape, optical disk, magnetic disk, and semiconductor memory, and stored in a re-distributable form.

4. Summary

As explained herein, according to the embodiment, by parallel operation of a plurality of approximating circuits provided corresponding to the context of the binary symbol sequences, the approximating operation of arithmetic coding of a plurality of groups divided on the basis of the context can be executed in parallel. That is, the approximate value of code amount of arithmetic coding of binary symbol sequences can be determined. As a result, in spite of the operation similar to arithmetic coding, as compared with the normal arithmetic coding, the processing time is saved substantially, and a coder is realized on the basis of code amount prediction of high precision by using a circuit suppressed low in the operation frequency. By using such coder, a video coder of high image quality is presented.

INDUSTRIAL APPLICABILITY

The invention realizes a coder of high image quality on the basis of code amount prediction of high precision by using a circuit suppressed low in the operation frequency, and is hence particularly effective in a recording apparatus such as camera recorder and image recording device in which real-time operation is demanded in a small circuit scale.

Although the present invention has been described in connection with specified embodiments thereof, many other modifications, corrections and applications are apparent to those skilled in the art. Therefore, the present invention is not limited by the disclosure provided herein but limited only to the scope of the appended claims. The present disclosure relates to subject matter contained in Japanese Patent Application No. 2006-323384, filed on Nov. 30, 2006, which is expressly incorporated herein by reference in its entirety.

The invention claimed is:

1. A coder comprising:
    a blocking circuit that generates, from an input signal, multivalued data, in specified coding unit, having a plurality of contexts;
    a binarizing circuit that converts the multivalued data generated by the blocking circuit into a binary symbol sequence;
    an arithmetic code amount approximating circuit that calculates a prediction code amount in the coding unit from the binary symbol sequence; and
    a coding circuit that codes the input signal arithmetically on the basis of the prediction code amount,
    wherein the arithmetic code amount approximating circuit includes:
    a selector that divides the binary symbol sequence contained in the specified coding unit into a plurality of groups based on the contexts;

a plurality of code amount approximating circuits, each of which is provided in each group and calculates, from the binary symbol sequence divided into a plurality of groups, the prediction code amount of the group, based on at least a section range in arithmetic coding; and an adder that adds the prediction code amounts from all code amount approximating circuits, and outputs the prediction code amount in the specified coding unit.

2. The coder according to claim 1, wherein the code amount approximating circuit sets the section range to a specified initial value upon start of the unit, in the unit of assembly of binary symbols having the same context continuously.

3. The coder according to claim 1, wherein the code amount approximating circuit converts into an integer code amount on the basis of a table receiving all coding patterns of the binary symbol sequences and all occurrence probability patterns, and adds to the prediction code amount of the group.

4. The coder according to claim 2, wherein the code amount approximating circuit converts the section range into a fraction code amount on the basis of a table approximated by logarithm of the section range at the end of the unit, and adds to the prediction code amount of the group.

5. The coder according to claim 1, further comprising:
a quantization parameter generating circuit that generates a first quantization parameter;
a first quantizing circuit that quantizes coefficient data generated on the basis of the input signal to generate the multivalued data, on the basis of the first quantization parameter;
a quantization parameter calculating circuit that generates a second quantization parameter;
a second quantizing circuit that quantizes coefficient data generated on the basis of the input signal to generate second multivalued data, on the basis of the second quantization parameter; and
an arithmetic coding circuit that arithmetically codes the second multivalued data,
wherein the quantization parameter calculating circuit calculates the second quantization parameter on the basis of the first quantization parameter, the prediction code amount in the specified coding unit, and the specified code amount to be applied in coding process.

6. The coder according to claim 5, wherein the quantization parameter generating circuit sets Q pieces (Q being a natural number of 2 or more) of representative quantization parameters, selects one arbitrary quantization parameter in the every specified coding unit from the Q pieces of representative quantization parameters, and generates a first quantization parameter for quantizing N pieces (N being a natural number of 2 or more) of the coefficient data.

7. The coder according to claim 6, wherein the number N satisfies the relation of $N=L \times Q$ (L being a natural number).

8. The coder according to claim 6, wherein Q pieces of representative quantization parameters always include the maximum value and minimum value of the quantization parameters.

9. The coder according to claim 5, wherein the input signal is a video signal, and the coefficient data is the coefficient converted from the input signal into frequency component.

10. The coder according to claim 9, wherein the context is a value different at least between the coefficient data of luminance in the video signal and the coefficient data of color difference, and the selector divides at least the coefficient data of luminance and the coefficient data of color difference into different groups.

* * * * *